US012690211B2

(12) United States Patent

Nakamura

(10) Patent No.: US 12,690,211 B2

(45) Date of Patent: Jul. 21, 2026

(54) SEMICONDUCTOR DEVICE

(71) Applicants:Kabushiki Kaisha Toshiba, Tokyo (JP); Toshiba Electronic Devices & Storage Corporation, Tokyo (JP)

(72) Inventor: Kazutoshi Nakamura, Nonoichi Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 349 days.

(21) Appl. No.: 18/592,123

(22) Filed: Feb. 29, 2024

(65) Prior Publication Data

US 2025/0107125 A1 Mar. 27, 2025

(30) Foreign Application Priority Data

Sep. 22, 2023 (JP) ................................. 2023-158094

(51) Int. Cl.
H10D 12/00 (2025.01)
H10D 8/00 (2025.01)
(Continued)

(52) U.S. Cl.
CPC ............. H10D 12/481 (2025.01); H10D 8/00 (2025.01); H10D 62/10 (2025.01);
(Continued)

(58) Field of Classification Search
CPC ...... H10D 12/481; H10D 12/038; H10D 8/00; H10D 62/127; H10D 62/393; H10D 64/117; H10D 64/23
See application file for complete search history.

(56) References Cited

U.S. PATENT DOCUMENTS 7,498,634 B2    3/2009  Tsuzuki et al.
11,296,213 B2   4/2022  Sandow et al.
(Continued)

FOREIGN PATENT DOCUMENTS

JP      2010-171326 A    8/2010
JP         5034461 B2    9/2012
(Continued)

OTHER PUBLICATIONS

Unpublished U.S. Appl. No. 18/463,138, filed Sep. 7, 2023.

*Primary Examiner* — Mohsen Ahmadi
(74) *Attorney, Agent, or Firm* — Kim & Stewart LLP

(57) ABSTRACT

A semiconductor device of embodiments includes a transistor region and a diode region. The transistor region includes: a first conductive type first semiconductor region, a second conductive type second semiconductor region, a first conductive type third semiconductor region in this order in a semiconductor layer; a second conductive type fourth semiconductor region and a first conductive type fifth semiconductor region on the third semiconductor region and arranged alternately in a first direction; a first conductive type sixth semiconductor region between the third and the fourth semiconductor region a first trench spaced from the sixth semiconductor region; a gate electrode in the first trench; a first electrode having a first portion, a bottom surface of the first portion being in contact with the third semiconductor region and side surfaces of the first portion being in contact with the fourth, the fifth, and the sixth semiconductor regions; and a second electrode.

14 Claims, 19 Drawing Sheets

(51) Int. Cl.

| | |
|---|---|
| *H10D 12/01* | (2025.01) |
| *H10D 62/10* | (2025.01) |
| *H10D 62/17* | (2025.01) |
| *H10D 64/00* | (2025.01) |
| *H10D 64/23* | (2025.01) |
| *H10D 64/27* | (2025.01) |
| *H10D 64/64* | (2025.01) |
| *H10D 84/60* | (2025.01) |

(52) U.S. Cl.
CPC ......... *H10D 62/127* (2025.01); *H10D 64/513* (2025.01); *H10D 84/617* (2025.01)

(56) References Cited

U.S. PATENT DOCUMENTS

| | | | | |
|---|---|---|---|---|
| 2009/0184352 | A1* | 7/2009 | Yamaguchi | H10D 84/83 |
| | | | | 257/296 |
| 2009/0242977 | A1* | 10/2009 | Kawaguchi | H10D 30/668 |
| | | | | 257/330 |
| 2009/0278166 | A1* | 11/2009 | Soeno | H10D 12/481 |
| | | | | 257/133 |

| | | | | |
|---|---|---|---|---|
| 2009/0283798 | A1 | 11/2009 | Tsuzuki et al. | |
| 2012/0049273 | A1* | 3/2012 | Hirler | H10D 84/141 |
| | | | | 257/330 |
| 2015/0155277 | A1* | 6/2015 | Ogura | H10D 84/617 |
| | | | | 257/140 |
| 2019/0252533 | A1* | 8/2019 | Naito | H10D 62/127 |
| 2020/0020800 | A1* | 1/2020 | Kumada | H10D 30/668 |
| 2020/0091326 | A1* | 3/2020 | Iwakaji | H10D 62/133 |
| 2020/0303525 | A1* | 9/2020 | Iwakaji | H10D 64/516 |
| 2021/0091072 | A1* | 3/2021 | Matsudai | H10D 62/142 |
| 2022/0416064 | A1* | 12/2022 | Soneda | H10D 62/127 |
| 2023/0036039 | A1 | 2/2023 | Matsui et al. | |
| 2023/0207674 | A1 | 6/2023 | Kubouchi et al. | |
| 2023/0307444 | A1* | 9/2023 | Matsudai | H10D 62/129 |
| 2024/0096965 | A1 | 3/2024 | Mitsuzuka et al. | |
| 2024/0321869 | A1 | 9/2024 | Nakamura et al. | |

FOREIGN PATENT DOCUMENTS

| | | |
|---|---|---|
| JP | 2021-168379 A | 10/2021 |
| JP | 2023-019322 A | 2/2023 |
| JP | 2024-135983 A | 10/2024 |
| WO | 2023/127255 A1 | 7/2023 |

* cited by examiner

AA' CROSS SECTION

FIG.3

BB' CROSS SECTION

XX' CROSS SECTION

FIG.6

YY' CROSS SECTION

XX' CROSS SECTION

AA' CROSS SECTION

CC' CROSS SECTION

FIG.12

DD' CROSS SECTION

EE' CROSS SECTION

FF' CROSS SECTION

GG' CROSS SECTION

FIG.18

HH' CROSS SECTION

SEMICONDUCTOR DEVICE

CROSS-REFERENCE TO RELATED APPLICATION

This application is based upon and claims the benefit of priority from Japanese Patent Application No. 2023-158094, filed on Sep. 22, 2023, the entire contents of which are incorporated herein by reference.

FIELD

Embodiments described herein relate generally to a semiconductor device.

BACKGROUND

An example of a power semiconductor device is an insulated gate bipolar transistor (IGBT). In the IGBT, for example, a p-type collector region, an n-type drift region, and a p-type base region are provided on a collector electrode. Then, in a trench that penetrates through the p-type base region to reach the n-type drift region, a gate electrode is provided with a gate insulating film interposed therebetween. In addition, an n-type emitter region connected to an emitter electrode is provided in a region adjacent to the trench on the surface of the p-type base region.

In recent years, a reverse-conducting IGBT (RC-IGBT) in which an IGBT and a freewheeling diode are formed in the same semiconductor chip has been widely developed and commercialized. The RC-IGBT is used, for example, as a switching element in an inverter circuit. The freewheeling diode has a function of making a current flow in a direction opposite to the on-current of the IGBT. Forming the IGBT and the freewheeling diode in the same semiconductor chip has many advantages, such as a reduction in chip size due to sharing the termination region and dispersion of heat generation locations.

In the RC-IGBT, there is a possibility that the operation of the IGBT and the operation of the diode will interfere with each other to degrade the element characteristics of the RC-IGBT. For example, when the diode is turned off, holes injected from the IGBT region at the boundary with the diode region may not be discharged to increase the reverse recovery current of the diode. When the reverse recovery current of the diode increases, the switching loss of the diode increases, and the switching loss of the RC-IGBT increases.

BRIEF DESCRIPTION OF THE DRAWINGS

FIG. 3 is a schematic top view of a part of the semiconductor device according to the first embodiment;

FIG. 6 is a schematic top view of a part of the semiconductor device according to the comparative example;

FIG. 12 is a schematic top view of a part of the semiconductor device according to the first modification example of the first embodiment;

FIG. 18 is a schematic top view of a part of the semiconductor device according to the second embodiment.

DETAILED DESCRIPTION

Figure 1:
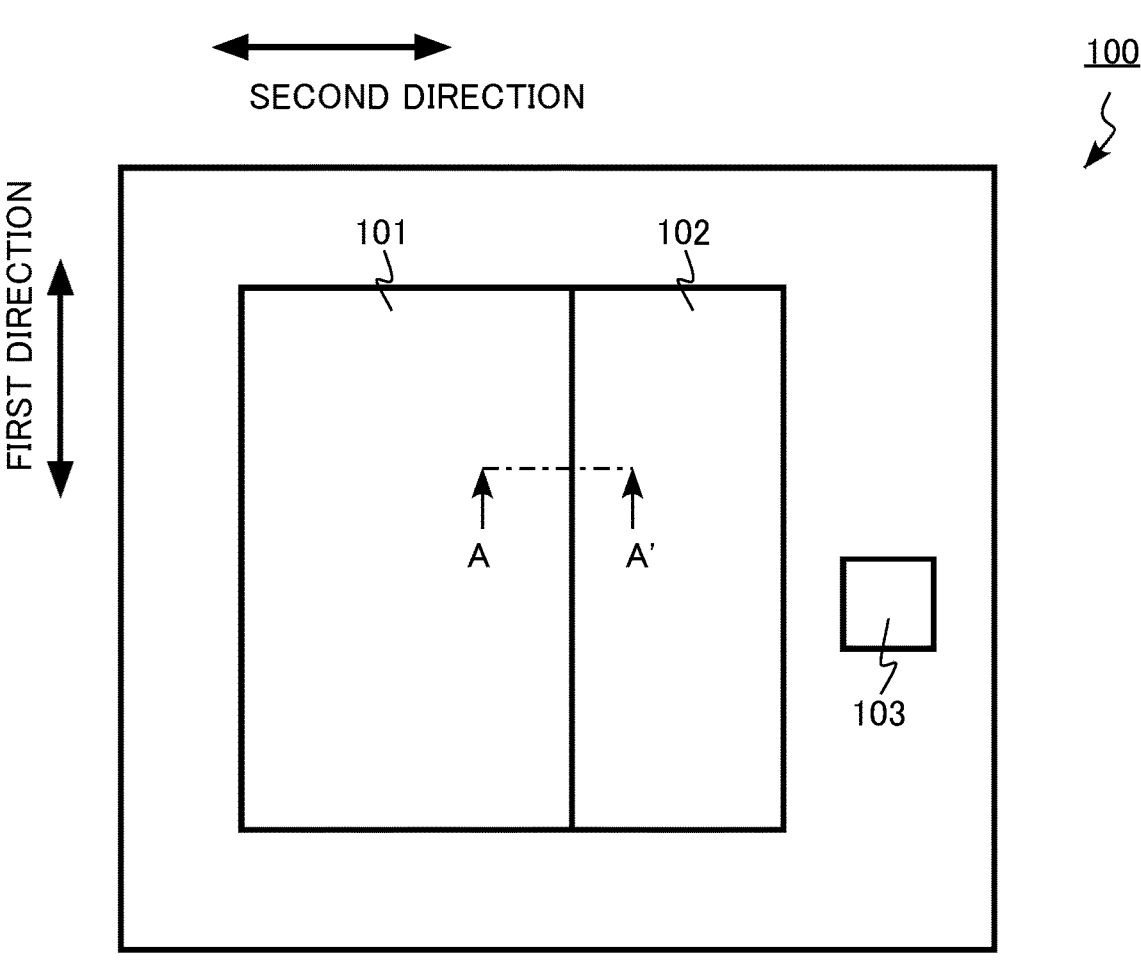
FIG. 1 is a schematic diagram of a semiconductor device according to a first embodiment.

A semiconductor device of embodiment includes a transistor region and a diode region. The transistor region includes: a semiconductor layer having a first face and a second face opposite to the first face; a first semiconductor region of a first conductive type provided in the semiconductor layer; a second semiconductor region of a second conductive type provided in the semiconductor layer and provided between the first semiconductor region and the first face; a third semiconductor region of the first conductive type provided in the semiconductor layer and provided between the second semiconductor region and the first face; a fourth semiconductor region of the second conductive type and a fifth semiconductor region of the first conductive type provided in the semiconductor layer, provided between the third semiconductor region and the first face, and arranged alternately in a first direction parallel to the first face; a sixth semiconductor region of the first conductive type provided between the third semiconductor region and the fourth semiconductor region and having a first conductive type impurity concentration higher than that in the third semiconductor region and lower than that in the fifth semiconductor region; a first trench provided on the first face side in the semiconductor layer, extending in the first direction, repeatedly arranged in a second direction parallel to the first face and perpendicular to the first direction, in contact with the second semiconductor region, the third semiconductor region, the fourth semiconductor region, and the fifth semiconductor region, and spaced from the sixth semiconductor region; a gate electrode provided in the first trench; a gate insulating film provided between the gate electrode and the third semiconductor region; a first electrode provided on the first face side with respect to the semiconductor layer and having a first portion, a bottom surface of the first portion being in contact with the third semiconductor region and side surfaces of the first portion being in contact with the fourth semiconductor region, the fifth semiconductor region, and the sixth semiconductor region; and a second electrode provided on the second face side with respect to the semiconductor layer and in contact with the first semiconductor region. The diode region includes: the semiconductor layer; the second semiconductor region; a seventh semiconductor region of the second conductive type provided in the semiconductor layer, provided between the second semiconductor region and the second face, and having a second conductive type impurity concentration higher than that in the second semiconductor region; an eighth semiconductor region of the first conductive type provided in the semiconductor layer and provided between the second semiconductor region and the first face; the first electrode electrically connected to the eighth semiconductor region; and the second electrode in contact with the seventh semiconductor region.

Hereinafter, embodiments will be described with reference to the diagrams. In the following description, the same or similar members and the like will be denoted by the same reference numerals, and the description of the members and the like once described will be omitted as appropriate.

In this specification, when there are notations of $n^+$-type, n-type, and $n^-$-type, this means that the n-type impurity concentration decreases in the order of $n^+$-type, n-type, and $n^-$-type. In addition, when there are notations of $p^+$-type, p-type, and $p^-$-type, this means that the p-type impurity concentration decreases in the order of $p^+$-type, p-type, and $p^-$-type.

In this specification, the n-type impurity concentration does not indicate the actual n-type impurity concentration, but indicates the effective n-type impurity concentration after compensation. Similarly, the p-type impurity concentration does not indicate the actual p-type impurity concentration, but indicates the effective p-type impurity concentration after compensation. For example, if the actual n-type impurity concentration is higher than the actual p-type impurity concentration, the n-type impurity concentration is obtained by subtracting the p-type impurity concentration from the actual n-type impurity concentration. The same applies to the p-type impurity concentration.

In this specification, the distribution and absolute value of the impurity concentration in a semiconductor region can be measured by using, for example, secondary ion mass spectrometry (SIMS). In addition, the relative magnitude relationship between the impurity concentrations in two semiconductor regions can be determined by using, for example, scanning capacitance microscopy (SCM). In addition, the distribution and absolute value of the impurity concentration can be measured by using, for example, spreading resistance analysis (SRA). By the SCM and the SRA, the relative magnitude relationship or absolute values of the carrier concentrations in semiconductor regions can be calculated. By assuming the activation rate of impurities, the relative magnitude relationship between the impurity concentrations in two semiconductor regions, the distribution of the impurity concentration, and the absolute value of the impurity concentration can be calculated from the measurement results of the SCM and the SRA.

First Embodiment

A semiconductor device according to a first embodiment includes a transistor region and a diode region. The transistor region includes: a semiconductor layer having a first face and a second face opposite to the first face; a first semiconductor region of a first conductive type provided in the semiconductor layer; a second semiconductor region of a second conductive type provided in the semiconductor layer and provided between the first semiconductor region and the first face; a third semiconductor region of the first conductive type provided in the semiconductor layer and provided between the second semiconductor region and the first face; a fourth semiconductor region of the second conductive type and a fifth semiconductor region of the first conductive type provided in the semiconductor layer, provided between the third semiconductor region and the first face, and arranged alternately in a first direction parallel to the first face; a sixth semiconductor region of the first conductive type provided between the third semiconductor region and the fourth semiconductor region and having a first conductive type impurity concentration higher than that in the third semiconductor region and lower than that in the fifth semiconductor region; a first trench provided on the first face side in the semiconductor layer, extending in the first direction, repeatedly arranged in a second direction parallel to the first face and perpendicular to the first direction, in contact with the second semiconductor region, the third semiconductor region, the fourth semiconductor region, and the fifth semiconductor region, and spaced from the sixth semiconductor region; a gate electrode provided in the first trench; a gate insulating film provided between the gate electrode and the third semiconductor region; a first electrode provided on the first face side with respect to the semiconductor layer and having a first portion, a bottom surface of the first portion being in contact with the third semiconductor region and side surfaces of the first portion being in contact with the fourth semiconductor region, the fifth semiconductor region, and the sixth semiconductor region; and a second electrode provided on the second face side with respect to the semiconductor layer and in contact with the first semiconductor region. The diode region includes: the semiconductor layer; the second semiconductor region; a seventh semiconductor region of the second conductive type provided in the semiconductor layer, provided between the second semiconductor region and the second face, and having a second conductive type impurity concentration higher than that in the second semiconductor region; an eighth semiconductor region of the first conductive type provided in the semiconductor layer and provided between the second semiconductor region and the first face; the first electrode electrically connected to the eighth semiconductor region; and the second electrode in contact with the seventh semiconductor region.

The semiconductor device according to the first embodiment is an RC-IGBT 100 in which an IGBT and a freewheeling diode are formed in the same semiconductor chip. The RC-IGBT 100 has a trench gate type IGBT including a gate electrode in a trench formed in a semiconductor layer. Hereinafter, a case where the first conductive type is p-type and the second conductive type is n-type will be described as an example.

FIG. 1 is a schematic diagram of the semiconductor device according to the first embodiment.

Figure 2:
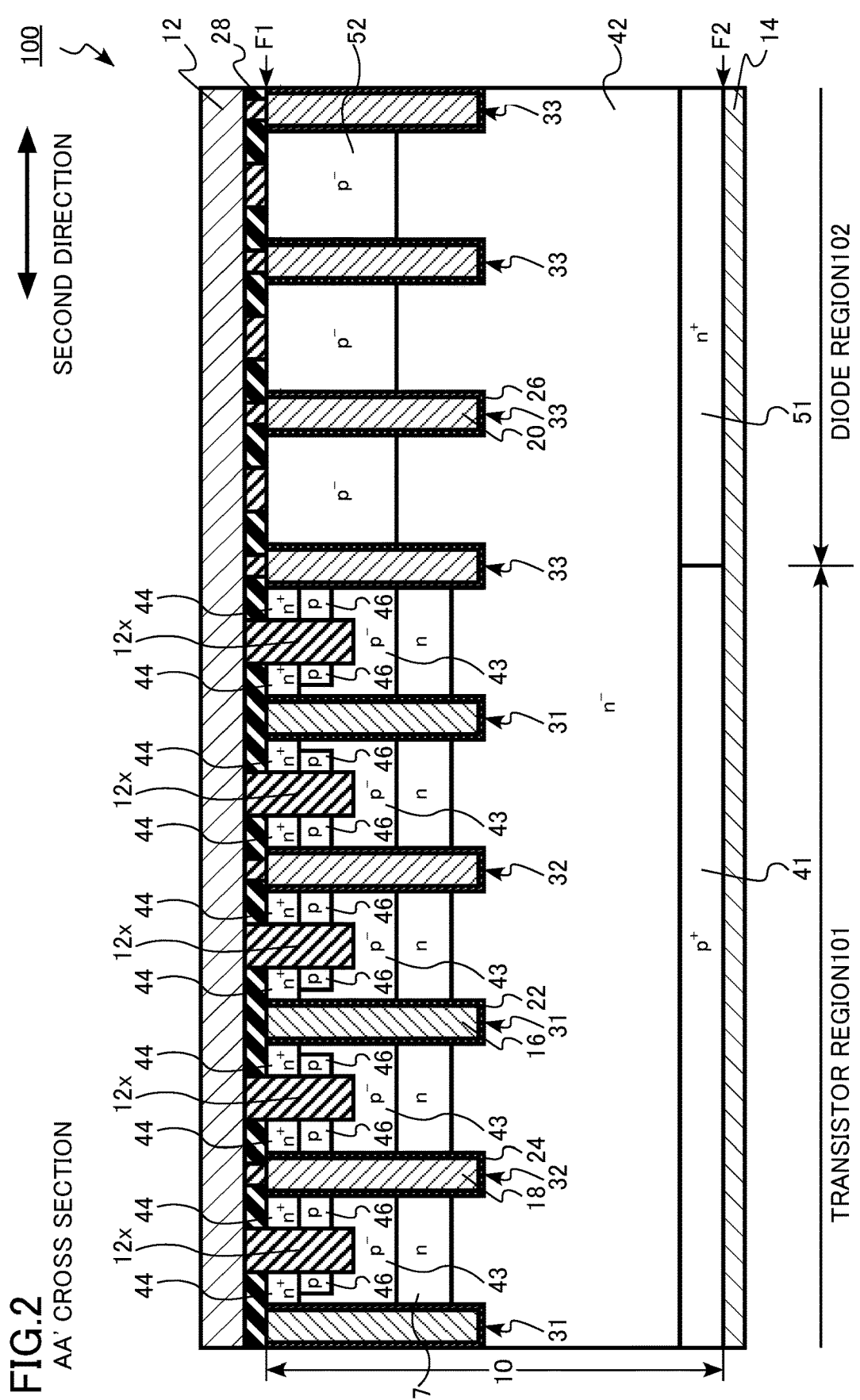
FIG. 2 is a schematic cross-sectional view of a part of the semiconductor device according to the first embodiment.

FIG. 2 is a schematic cross-sectional view of a part of the semiconductor device according to the first embodiment. FIG. 2 is a cross-sectional view taken along the line AA' of FIG. 1.

Figure 3:
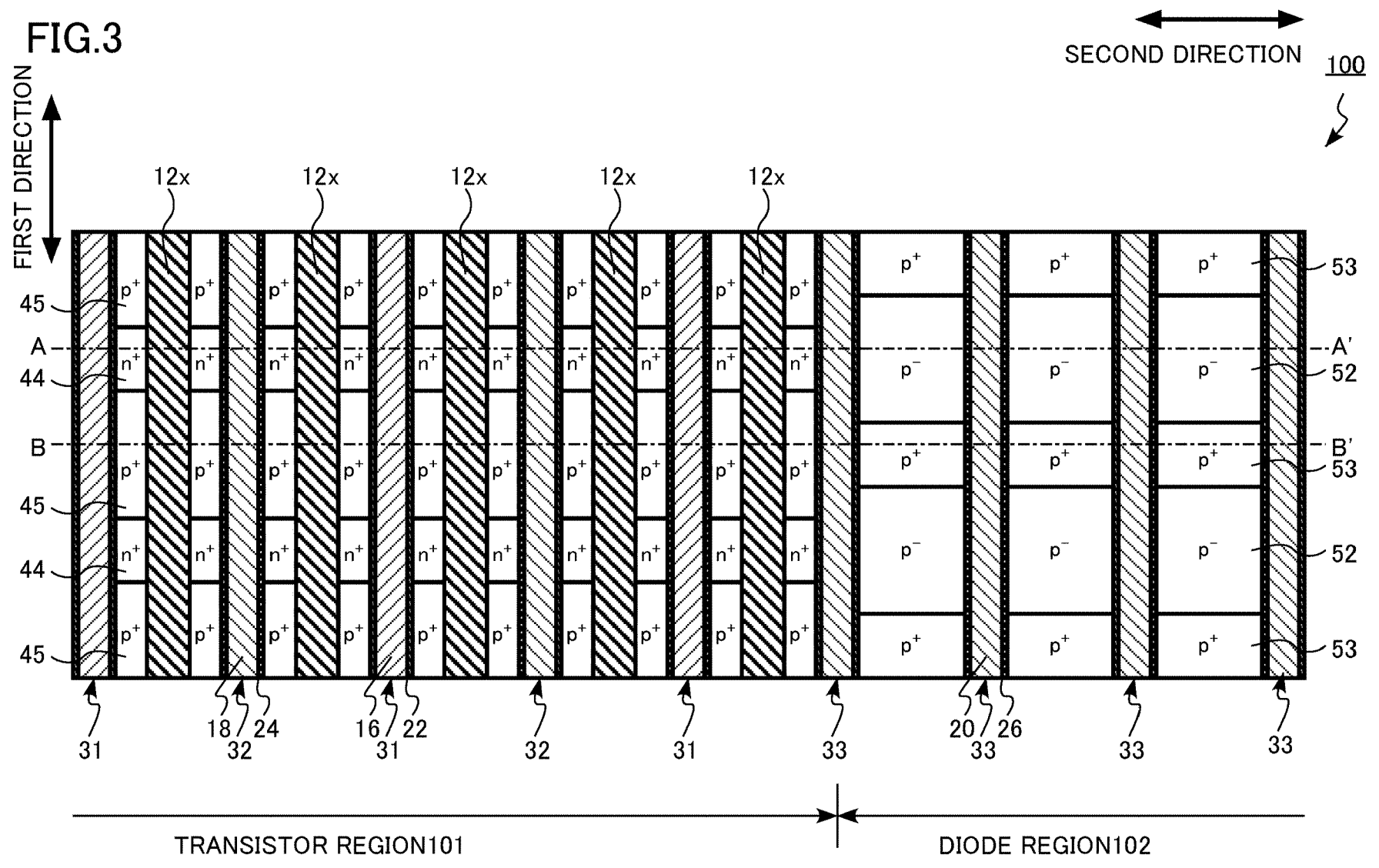

FIG. 3 is a schematic top view of a part of the semiconductor device according to the first embodiment. FIG. 3 is a top view on a first face F1. FIG. 2 is a cross-sectional view taken along the line AA' of FIG. 3.

Figure 4:
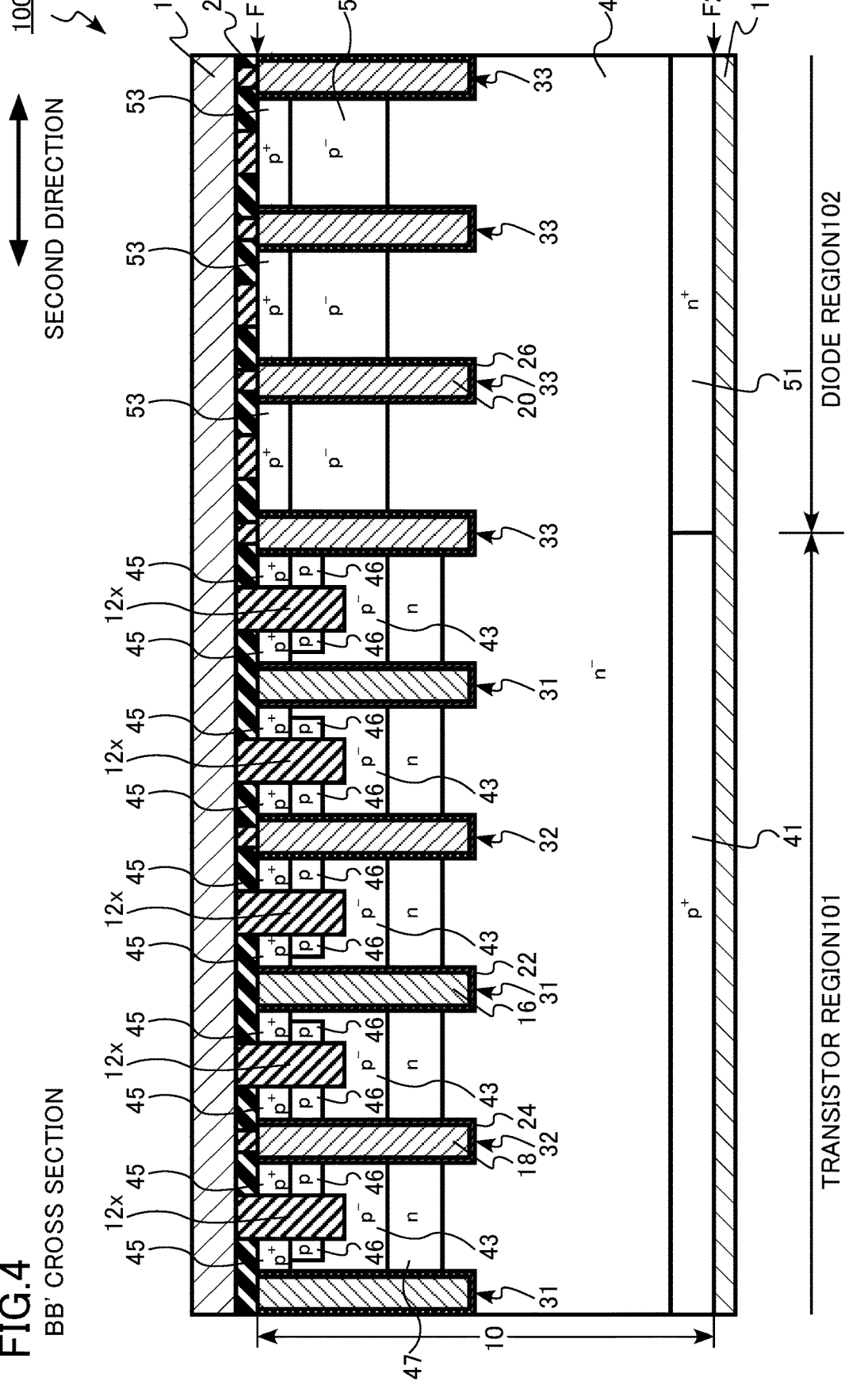
FIG. 4 is a schematic cross-sectional view of a part of the semiconductor device according to the first embodiment.

FIG. 4 is a schematic cross-sectional view of a part of the semiconductor device according to the first embodiment. FIG. 4 is a cross-sectional view taken along the line BB' of FIG. 3.

The semiconductor device according to the first embodiment is the RC-IGBT 100. The RC-IGBT 100 has a transistor region 101 and a diode region 102. The transistor region 101 operates as an IGBT. The diode region 102 operates as a freewheeling diode.

The RC-IGBT 100 according to the first embodiment includes a semiconductor layer 10, an upper electrode 12 (first electrode), a lower electrode 14 (second electrode), a gate electrode 16, a first conductive layer 18, a second conductive layer 20, a gate insulating film 22, a first insulating film 24, a second insulating film 26, an interlayer insulating layer 28, and a gate electrode pad 103.

The upper electrode 12 has a first trench contact portion 12$x$ (first portion).

In the semiconductor layer 10, a gate trench 31 (first trench), a first dummy trench 32 (second trench), a second dummy trench 33 (third trench), a collector region 41 (first semiconductor region), a drift region 42 (second semiconductor region), a base region 43 (third semiconductor region), an emitter region 44 (fourth semiconductor region), a cell contact region 45 (fifth semiconductor region), a resistance reduction region 46 (sixth semiconductor region), a barrier region 47 (tenth semiconductor region), a cathode region 51 (seventh semiconductor region), an anode region 52 (eighth semiconductor region), and a diode contact region 53 (ninth semiconductor region) are provided.

The semiconductor layer 10 has a first face F1 and a second face F2 opposite to the first face F1. The first face F1 and the second face F2 are substantially parallel, for example.

The semiconductor layer 10 is, for example, single crystal silicon. The thickness of the semiconductor layer 10 is, for example, equal to or more than 40 μm and equal to or less than 700 μm.

In this specification, one direction parallel to the first face F1 is referred to as a first direction. In addition, a direction parallel to the first face F1 and perpendicular to the first direction is referred to as a second direction. In addition, in this specification, the "depth" is defined as a distance in a direction toward the second face F2 with the first face F1 as a reference.

The transistor region 101 includes the semiconductor layer 10, the upper electrode 12 (first electrode), the lower electrode 14 (second electrode), the gate electrode 16, the first conductive layer 18, the gate insulating film 22, the first insulating film 24, and the interlayer insulating layer 28.

In the semiconductor layer 10 of the transistor region 101, the gate trench 31 (first trench), the first dummy trench 32 (second trench), the collector region 41 (first semiconductor region), the drift region 42 (second semiconductor region), the base region 43 (third semiconductor region), the emitter region 44 (fourth semiconductor region), the cell contact region 45 (fifth semiconductor region), the resistance reduction region 46 (sixth semiconductor region), and the barrier region 47 (tenth semiconductor region) are provided.

The upper electrode 12 is provided on the first face F1 side of the semiconductor layer 10. In the transistor region 101, the upper electrode 12 functions as an emitter electrode of the IGBT.

The upper electrode 12 has the first trench contact portion 12$x$. The first trench contact portion 12$x$ is formed in a trench provided in the semiconductor layer 10. The first trench contact portion 12$x$ extends in the first direction.

The bottom surface of the first trench contact portion 12$x$ is in contact with the base region 43. The side surfaces of the first trench contact portion 12$x$ are in contact with, for example, the base region 43, the emitter region 44, the cell contact region 45, and the resistance reduction region 46. The first trench contact portion 12$x$ is electrically connected to the base region 43, the emitter region 44, the cell contact region 45, and the resistance reduction region 46.

The contact between the first trench contact portion 12$x$ and the base region 43 is, for example, a Schottky contact. The contact between the first trench contact portion 12$x$ and the emitter region 44 and the cell contact region 45 is, for example, an ohmic contact. The contact between the first trench contact portion 12$x$ and the resistance reduction region 46 is a Schottky contact or an ohmic contact. It is preferable that the contact between the first trench contact portion 12$x$ and the resistance reduction region 46 is an ohmic contact.

The upper electrode 12 is, for example, a metal or a metal compound. The first trench contact portion 12$x$ and portions other than the first trench contact portion 12$x$ are formed of, for example, the same material. The first trench contact portion 12$x$ and the portions other than the first trench contact portion 12$x$ may be formed of different materials.

The lower electrode 14 is provided on the second face F2 side of the semiconductor layer 10. At least a part of the lower electrode 14 is in contact with the second face F2 of the semiconductor layer 10. In the transistor region 101, the lower electrode 14 functions as a collector electrode of the IGBT.

The lower electrode 14 is in contact with collector region 41 in transistor region 101. The lower electrode 14 is electrically connected to collector region 41 in transistor region 101.

The lower electrode 14 is, for example, a metal or a metal compound.

The collector region 41 is a p$^+$-type semiconductor region. The collector region 41 is in contact with the second face F2. The collector region 41 is electrically connected to the lower electrode 14. The collector region 41 is in contact with the lower electrode 14. The collector region 41 serves as a source of holes when the IGBT is ON.

The collector region 41 contains p-type impurities. The p-type impurity is, for example, boron (B). The p-type impurity concentration in the collector region 41 is, for example, equal to or more than $1 \times 10^{18}$ cm$^{-3}$ and equal to or less than $1 \times 10^{21}$ cm$^{-3}$.

The drift region 42 is an n$^-$-type semiconductor region. The drift region 42 is provided between the collector region 41 and the first face F1.

The drift region 42 serves as an on-current path when the IGBT is ON. The drift region 42 has a function of being depleted when the IGBT is OFF to maintain the breakdown voltage of the IGBT.

The drift region 42 contains n-type impurities. The n-type impurity is, for example, phosphorus (P) or arsenic (As). The n-type impurity concentration in the drift region 42 is, for example, equal to or more than $1 \times 10^{15}$ cm$^{-3}$ and equal to or less than $1 \times 10^{18}$ cm$^{-3}$.

The base region 43 is a p$^-$-type semiconductor region. The base region 43 is provided between the drift region 42 and the first face F1. The drift region 42 is interposed between the base region 43 and the collector region 41.

The depth of the base region 43 is, for example, equal to or less than 5 μm. In a region of the base region 43 facing the gate electrode 16, an n-type inversion layer is formed when the IGBT is ON. The base region 43 functions as a channel region of the IGBT.

The base region 43 contains p-type impurities. The p-type impurity is, for example, boron (B). The p-type impurity concentration in the base region 43 is, for example, equal to or more than $5\times10^{16}$ cm$^{-3}$ and equal to or less than $5\times10^{17}$ cm$^{-3}$.

The emitter region 44 is an n$^+$-type semiconductor region. The emitter region 44 is provided between the base region 43 and the first face F1. The emitter region 44 is in contact with the first face F1.

The emitter region 44 is in contact with the gate trench 31 and the first dummy trench 32. The emitter region 44 is in contact with the gate insulating film 22 and the first insulating film 24.

The emitter region 44 is in contact with the first trench contact portion 12x of the upper electrode 12. The emitter region 44 is electrically connected to the upper electrode 12. The emitter region 44 serves as a source of electrons when the IGBT is ON.

The emitter region 44 contains n-type impurities. The n-type impurity is, for example, phosphorus (P) or arsenic (As). The n-type impurity concentration in the emitter region 44 is higher than the n-type impurity concentration in the drift region 42. The n-type impurity concentration in the emitter region 44 is, for example, equal to or more than $1\times10^{19}$ cm$^{-3}$ and equal to or less than $1\times10^{21}$ cm$^{-3}$.

The cell contact region 45 is a p$^+$-type semiconductor region. The cell contact region 45 is provided between the base region 43 and the first face F1. The cell contact region 45 is in contact with the first face F1.

The cell contact region 45 is in contact with the gate trench 31 and the first dummy trench 32. The cell contact region 45 is in contact with the gate insulating film 22 and the first insulating film 24.

The cell contact region 45 is in contact with the first trench contact portion 12x of the upper electrode 12. The cell contact region 45 is electrically connected to the upper electrode 12.

The cell contact region 45 contains p-type impurities. The p-type impurity is, for example, boron (B). The p-type impurity concentration in the cell contact region 45 is higher than the p-type impurity concentration in the base region 43. The p-type impurity concentration in the cell contact region 45 is, for example, equal to or more than $5\times10^{19}$ cm$^{-3}$ and equal to or less than $1\times10^{21}$ cm$^{-3}$.

As shown in FIG. 3, the emitter region 44 and the cell contact region 45 are alternately arranged in the first direction on the first face F1. The width of the emitter region 44 in the first direction on the first face F1 is smaller than the width of the cell contact region 45 in the first direction on the first face F1, for example.

The resistance reduction region 46 is a p-type semiconductor region. The resistance reduction region 46 is provided between the base region 43 and the emitter region 44. The resistance reduction region 46 is in contact with the base region 43 and the emitter region 44, for example.

The resistance reduction region 46 is provided between the base region 43 and the cell contact region 45, for example. The resistance reduction region 46 is in contact with the base region 43 and the cell contact region 45, for example. For example, the resistance reduction region 46 extends in the first direction.

The resistance reduction region 46 is in contact with the first trench contact portion 12x of the upper electrode 12. The resistance reduction region 46 is in contact with the side surfaces of the first trench contact portion 12x. The resistance reduction region 46 is electrically connected to the upper electrode 12.

The resistance reduction region 46 is spaced from the gate trench 31. The resistance reduction region 46 is spaced apart the gate insulating film 22. The resistance reduction region 46 is provided between the gate trench 31 and the first trench contact portion 12x, for example. For example, the base region 43 is provided between the resistance reduction region 46 and the gate trench 31. The base region 43 between the resistance reduction region 46 and the gate trench 31 functions as a channel region of the IGBT.

The resistance reduction region 46 is in contact with the first dummy trench 32. The resistance reduction region 46 is in contact with the first insulating film 24.

The depth of the resistance reduction region 46 is smaller than the depth of the first trench contact portion 12x.

The resistance reduction region 46 reduces the electrical resistance of the lower portion of the emitter region 44. The resistance reduction region 46 functions as a path for holes to escape to the upper electrode 12 when the IGBT is turned off. Since the resistance reduction region 46 is provided, the operation of the parasitic npn transistor is suppressed, so that the latch-up immunity of the RC-IGBT 100 is improved. In addition, since the resistance reduction region 46 is in contact with the first dummy trench 32, the hole current is discharged along the sidewalls of the first dummy trench 32, so that the resistance reduction region 46 functions effectively. Therefore, the latch-up immunity can be improved compared to when the resistance reduction region 46 is not in contact with the first dummy trench 32.

The resistance reduction region 46 contains p-type impurities. The p-type impurity is, for example, boron (B). The p-type impurity concentration in the resistance reduction region 46 is higher than the p-type impurity concentration in the base region 43 and lower than the p-type impurity concentration in the cell contact region 45. The p-type impurity concentration of the resistance reduction region 46 is, for example, equal to or more than $5\times10^{17}$ cm$^{-3}$ and equal to or less than $1\times10^{19}$ cm$^{-3}$.

The barrier region 47 is an n-type semiconductor region. The barrier region 47 is provided between the drift region 42 and the base region 43.

The barrier region 47 has a function of promoting accumulation of carriers when the IGBT is ON to reduce the on-resistance.

The barrier region 47 contains n-type impurities. The n-type impurity is, for example, phosphorus (P) or arsenic (As). The n-type impurity concentration in the barrier region 47 is, for example, equal to or more than $5\times10^{15}$ cm$^{-3}$ and equal to or less than $5\times10^{18}$ cm$^{-3}$.

The gate trench 31 is provided on the first face F1 side of the semiconductor layer 10. The gate trench 31 is a groove provided in the semiconductor layer 10. The gate trench 31 is a part of the semiconductor layer 10.

As shown in FIG. 3, the gate trench 31 extends on the first face F1 in the first direction parallel to the first face F1. The gate trench 31 has a stripe shape. A plurality of gate trenches 31 are repeatedly arranged in the second direction perpendicular to the first direction.

The gate trench 31 is in contact with the drift region 42, the barrier region 47, the base region 43, the emitter region 44, and the cell contact region 45. The gate trench 31 is spaced from the resistance reduction region 46. This is because when the resistance reduction region 46 is in contact with the gate trench 31, the threshold voltage becomes higher than the desired value because the impurity concentration in the resistance reduction region 46 is higher than that in the base region 43, making driving difficult. The gate trench 31 passes through the base region 43 and the barrier region 47 to reach the drift region 42. The depth of the gate trench 31 is, for example, equal to or less than 8 μm.

The gate electrode 16 is provided in the gate trench 31. The gate electrode 16 is, for example, a semiconductor or a metal. The gate electrode 16 is, for example, amorphous silicon or polycrystalline silicon containing n-type or p-type impurities. The gate electrode 16 is electrically connected to the gate electrode pad 103.

The gate insulating film 22 is provided between the gate electrode 16 and the semiconductor layer 10. The gate insulating film 22 is provided between the gate electrode 16 and the drift region 42, between the gate electrode 16 and the base region 43, between the gate electrode 16 and the emitter region 44, and between the gate electrode 16 and the cell contact region 45. The gate insulating film 22 is, for example, a silicon oxide.

The first dummy trench 32 is provided on the first face F1 side of the semiconductor layer 10. The first dummy trench 32 is a groove provided in the semiconductor layer 10. The first dummy trench 32 is a part of the semiconductor layer 10.

As shown in FIG. 3, the first dummy trench 32 extends on the first face F1 in the first direction parallel to the first face F1. The first dummy trench 32 has a stripe shape. A plurality of first dummy trenches 32 are repeatedly arranged in the second direction perpendicular to the first direction. The first dummy trench 32 is provided between the two gate trenches 31 adjacent to each other.

The first dummy trench 32 is in contact with the drift region 42, the barrier region 47, the base region 43, the emitter region 44, the cell contact region 45, and the resistance reduction region 46. The first dummy trench 32 passes through the base region 43 and the barrier region 47 to reach the drift region 42. The depth of the first dummy trench 32 is, for example, equal to or less than 8 μm.

The first conductive layer 18 is provided in the first dummy trench 32. The first conductive layer 18 is, for example, a semiconductor or a metal. The first conductive layer 18 is, for example, amorphous silicon or polycrystalline silicon containing n-type impurities or p-type impurities.

The first conductive layer 18 is electrically connected to the upper electrode 12, for example. It is also possible to connect the first conductive layer 18 to an electrode other than the upper electrode 12 and apply a voltage different from the voltage for the upper electrode 12 to the first conductive layer 18. For example, the first conductive layer 18 may be electrically connected to the gate electrode pad 103.

The first insulating film 24 is provided between the first conductive layer 18 and the semiconductor layer 10. The first insulating film 24 is provided between the first conductive layer 18 and the drift region 42, between the first conductive layer 18 and the base region 43, between the first conductive layer 18 and the emitter region 44, between the first conductive layer 18 and the cell contact region 45, and between the first conductive layer 18 and the resistance reduction region 46. The first insulating film 24 is, for example, a silicon oxide.

The interlayer insulating layer 28 is provided between the gate electrode 16 and the upper electrode 12. The interlayer insulating layer 28 electrically isolates the gate electrode 16 and the upper electrode 12 from each other. For example, the first conductive layer 18 and the upper electrode 12 are electrically connected to each other by using an opening provided in the interlayer insulating layer 28. The interlayer insulating layer 28 is, for example, a silicon oxide.

The diode region 102 includes the semiconductor layer 10, the upper electrode 12 (first electrode), the lower electrode 14 (second electrode), the second conductive layer 20, and the second insulating film 26.

In the semiconductor layer 10 of the diode region 102, the second dummy trench 33 (third trench), the drift region 42 (second semiconductor region), the cathode region 51 (seventh semiconductor region), the anode region 52 (eighth semiconductor region), and the diode contact region 53 (ninth semiconductor region) are provided.

In the diode region 102, the upper electrode 12 functions as an anode electrode of the diode. The upper electrode 12 is in contact with the anode region 52 and the diode contact region 53. The upper electrode 12 is electrically connected to the anode region 52 and the diode contact region 53.

The contact between the upper electrode 12 and the diode contact region 53 is, for example, an ohmic contact. In addition, the contact between the upper electrode 12 and the anode region 52 is, for example, a Schottky contact.

The upper electrode 12 and the anode region 52 are in contact with each other on the first face F1. The position where the upper electrode 12 and the anode region 52 are in contact with each other is shallower than the depth of the diode contact region 53.

In the diode region 102, the lower electrode 14 functions as a cathode electrode of the diode. The lower electrode 14 is in contact with the cathode region 51.

The cathode region 51 is an n$^+$-type semiconductor region. The cathode region 51 is in contact with the second face F2. The cathode region 51 serves as a source of electrons when the diode is ON. The cathode region 51 is in contact with the lower electrode 14.

The drift region 42 is an n$^-$-type semiconductor region. The drift region 42 is provided between the cathode region 51 and the first face F1. The n-type impurity concentration in the drift region 42 is lower than the n-type impurity concentration in the cathode region 51.

The drift region 42 serves as an on-current path when the diode is ON.

The anode region 52 is a p-type semiconductor region. The anode region 52 is provided between the drift region 42 and the first face F1. The drift region 42 is interposed between the anode region 52 and the cathode region 51.

The anode region 52 serves as a source of holes when the diode is ON.

The diode contact region 53 is a p$^+$-type semiconductor region. The diode contact region 53 is provided between the anode region 52 and the first face F1.

The diode contact region 53 is in contact with the upper electrode 12. The diode contact region 53 is electrically connected to the upper electrode 12.

The p-type impurity concentration in the diode contact region 53 is higher than the p-type impurity concentration in the anode region 52.

The second dummy trench 33 is provided on the first face F1 side of the semiconductor layer 10. The second dummy trench 33 is a groove provided in the semiconductor layer 10. The second dummy trench 33 is a part of the semiconductor layer 10.

As shown in FIG. 3, the second dummy trench 33 extends on the first face F1 in the first direction parallel to the first face F1. The second dummy trench 33 has a stripe shape. A plurality of second dummy trenches 33 are repeatedly arranged in the second direction perpendicular to the first direction.

The second dummy trench 33 is in contact with the drift region 42, the anode region 52, and the diode contact region 53. The second dummy trench 33 passes through the anode region 52 to reach the drift region 42. The depth of the second dummy trench 33 is, for example, equal to or less than 8 μm.

The second conductive layer 20 is provided in the second dummy trench 33. The second conductive layer 20 is, for example, a semiconductor or a metal. The second conductive layer 20 is, for example, amorphous silicon or polycrystalline silicon containing n-type impurities or p-type impurities.

The second conductive layer 20 is electrically connected to the upper electrode 12, for example. It is also possible to connect the second conductive layer 20 to an electrode other than the upper electrode 12 and apply a voltage different from the voltage for the upper electrode 12 to the second conductive layer 20.

The second insulating film 26 is provided between the second conductive layer 20 and the semiconductor layer 10. The second insulating film 26 is provided between the second conductive layer 20 and the drift region 42, between the second conductive layer 20 and the anode region 52, and between the second conductive layer 20 and the diode contact region 53. The second insulating film 26 is in contact with the drift region 42, the anode region 52, and the diode contact region 53. The second insulating film 26 is, for example, a silicon oxide.

The interlayer insulating layer 28 is provided between the second conductive layer 20 and the upper electrode 12. For example, the second conductive layer 20 and the upper electrode 12 are electrically connected to each other by using an opening provided in the interlayer insulating layer 28.

The gate electrode pad 103 is provided on the first face F1 side of the semiconductor layer 10. The gate electrode pad 103 is electrically connected to the gate electrode 16. The gate electrode pad 103 and the gate electrode 16 are connected to each other by using, for example, a metal wiring (not shown).

A gate voltage is applied to the gate electrode pad 103.

Next, the function and effect of the semiconductor device according to the first embodiment will be described.

In the RC-IGBT 100 according to the first embodiment, it is possible to achieve both a reduction in switching loss and an improvement in latch-up immunity. The RC-IGBT 100 includes the first trench contact portion 12*x* and the resistance reduction region 46 in the transistor region 101. Then, the bottom surface of the first trench contact portion 12*x* is in contact with the base region 43. In particular, since the RC-IGBT 100 has the above configuration, it is possible to achieve both a reduction in switching loss and an improvement in latch-up immunity. Details description will be given below.

Figure 5:
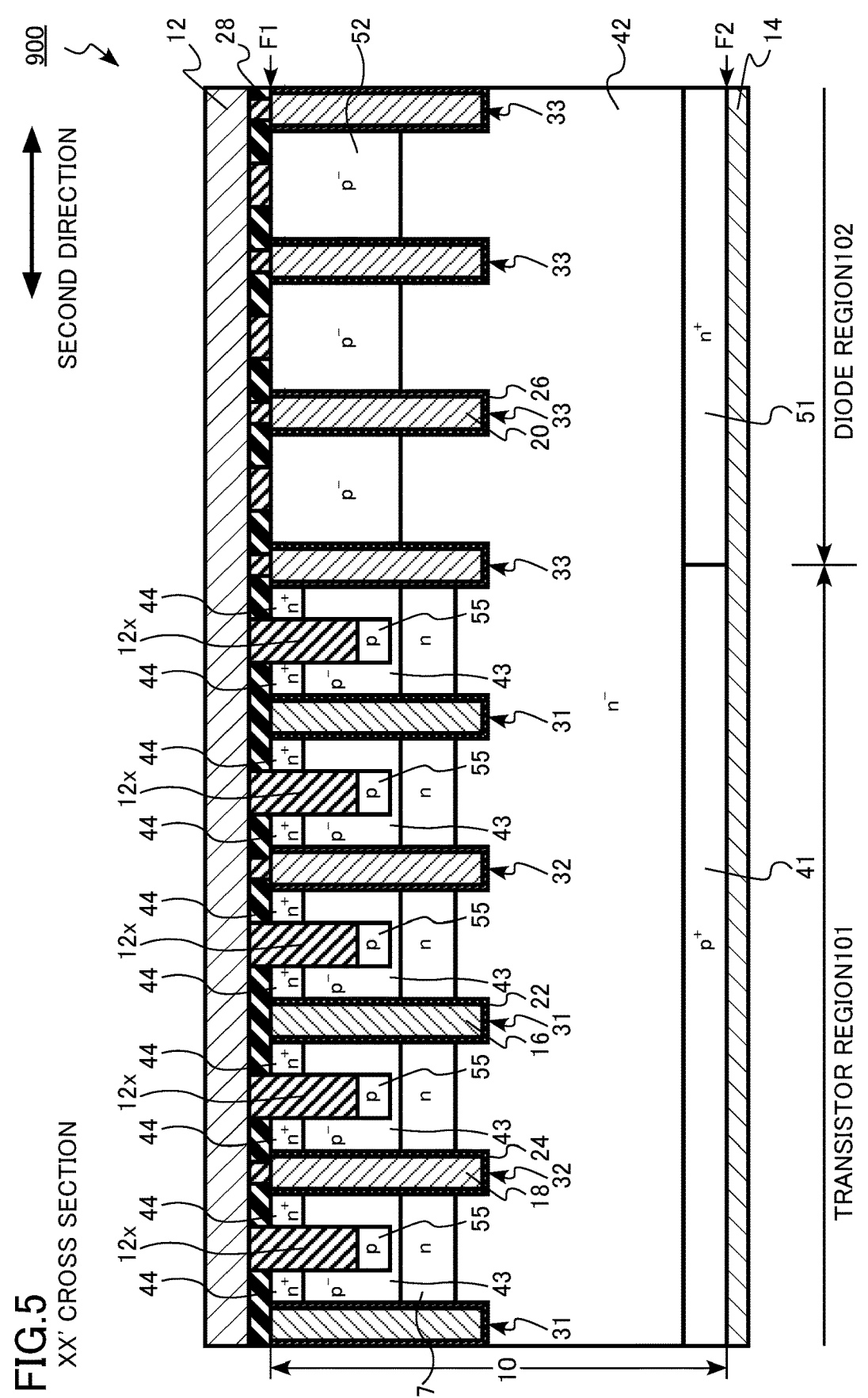
FIG. 5 is a schematic cross-sectional view of a part of a semiconductor device according to a comparative example.

FIG. 5 is a schematic cross-sectional view of a part of a semiconductor device according to a comparative example. FIG. 5 is a cross-sectional view taken along the line XX' of FIG. 6. FIG. 5 is a diagram corresponding to FIG. 2 in the first embodiment.

Figure 6:
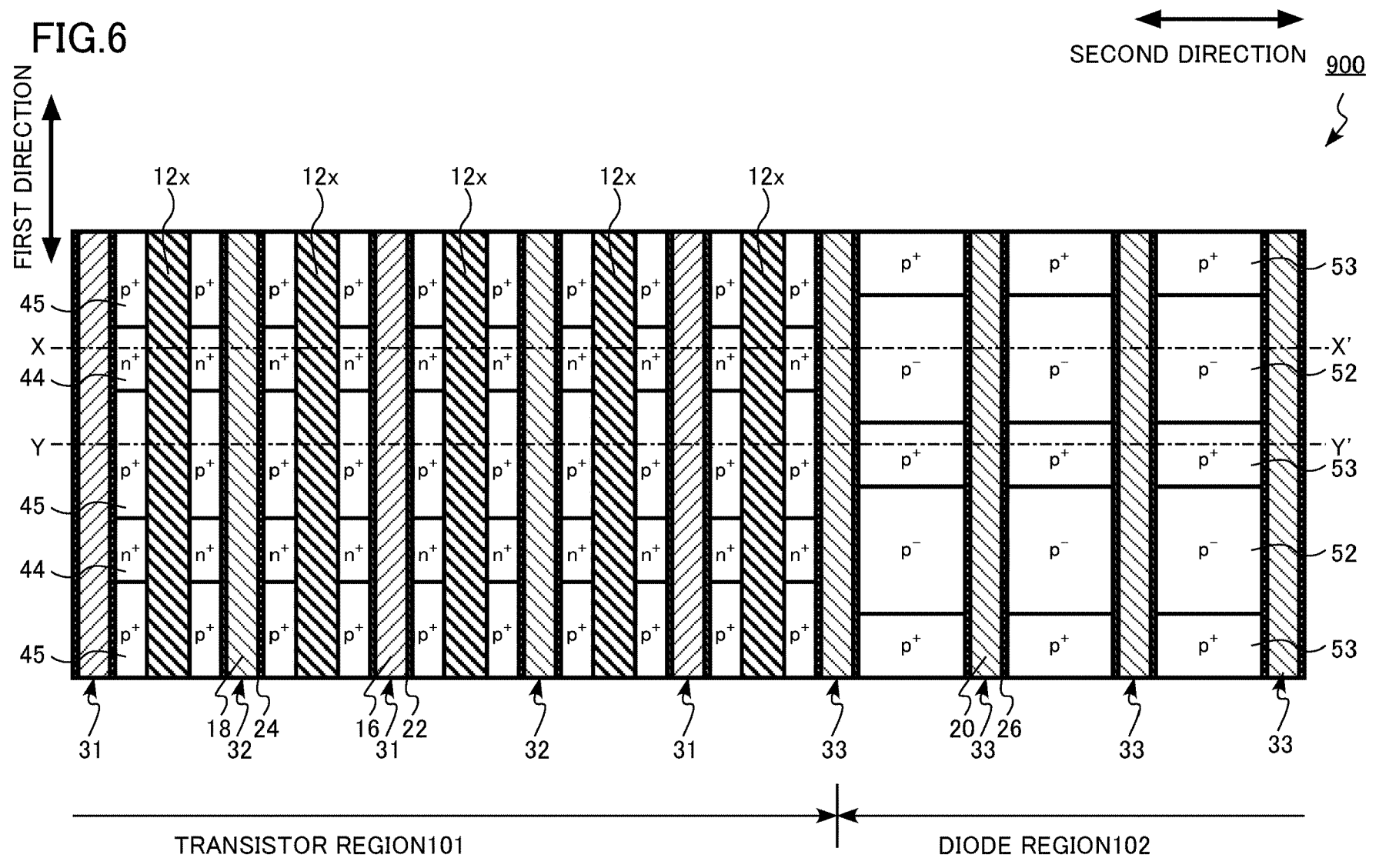

FIG. 6 is a schematic top view of a part of the semiconductor device according to the comparative example. FIG. 6 is a top view on the first face F1. FIG. 6 is a diagram corresponding to FIG. 3 according to the first embodiment.

Figure 7:
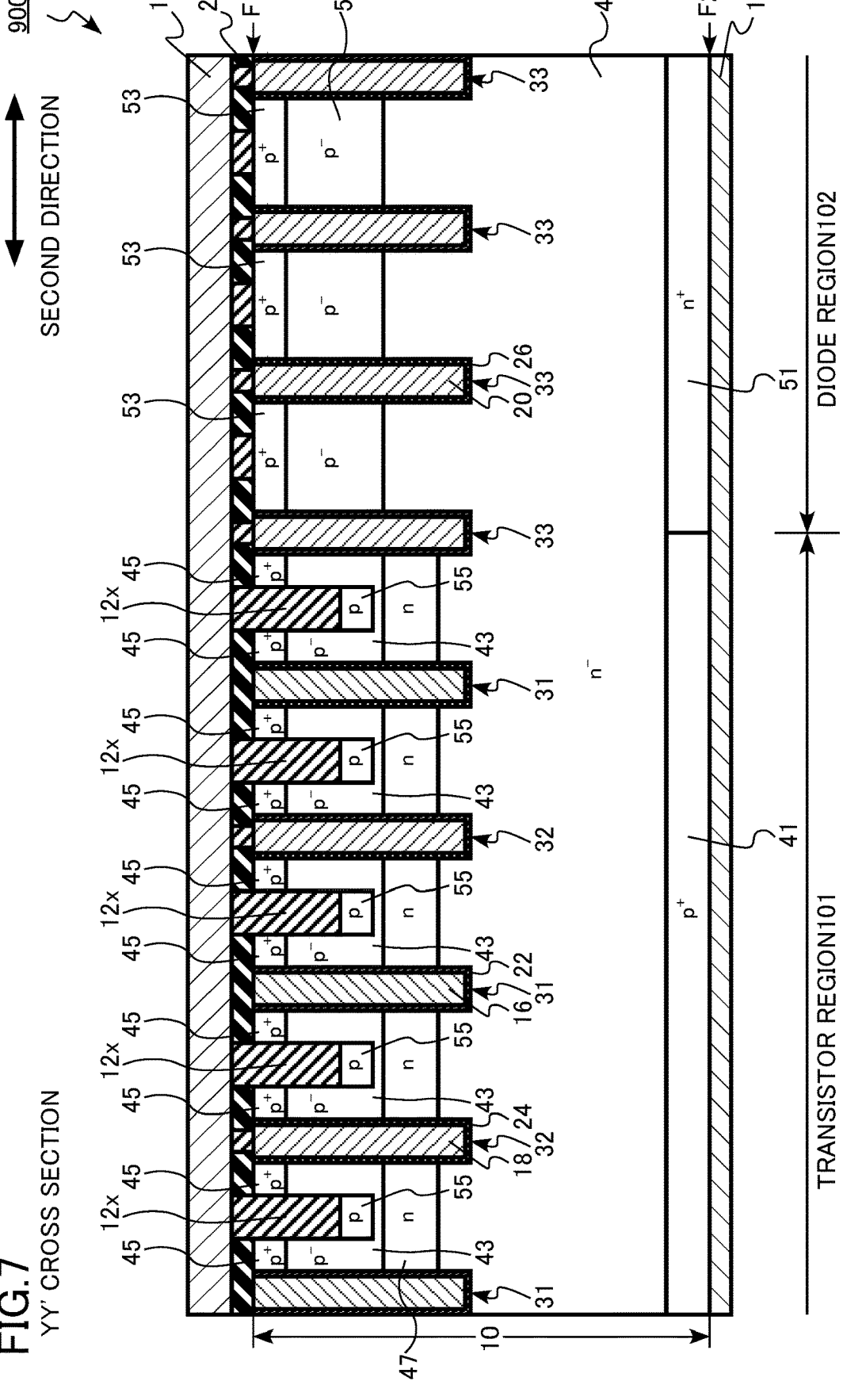
FIG. 7 is a schematic cross-sectional view of a part of the semiconductor device according to the comparative example.

FIG. 7 is a schematic cross-sectional view of a part of the semiconductor device according to the comparative example. FIG. 7 is a cross-sectional view taken along the line YY' of FIG. 6. FIG. 7 is a diagram corresponding to FIG. 4 in the first embodiment.

The semiconductor device according to the comparative example is an RC-IGBT 900. The RC-IGBT 900 is different from the RC-IGBT 100 according to the first embodiment in that the resistance reduction region 46 is not provided and a p-type region 55 is provided.

The p-type region 55 is a p-type semiconductor region. The p-type region 55 is provided between the base region 43 and the first trench contact portion 12*x*. The p-type region 55 is in contact with the bottom surface of the first trench contact portion 12*x*.

The p-type impurity concentration in the p-type region 55 is higher than the p-type impurity concentration in the base region 43. The contact between the first trench contact portion 12*x* and the p-type region 55 is, for example, an ohmic contact.

The RC-IGBT 900 according to the comparative example includes the p-type region 55 in contact with the bottom surface of the first trench contact portion 12*x*. Providing the p-type region 55 promotes the discharge of holes from the p-type region 55 to the upper electrode 12 when the IGBT is turned off. Therefore, the operation of the parasitic npn transistor in the transistor region is suppressed. As a result, the latch-up immunity of the RC-IGBT 900 is improved.

Figure 8:
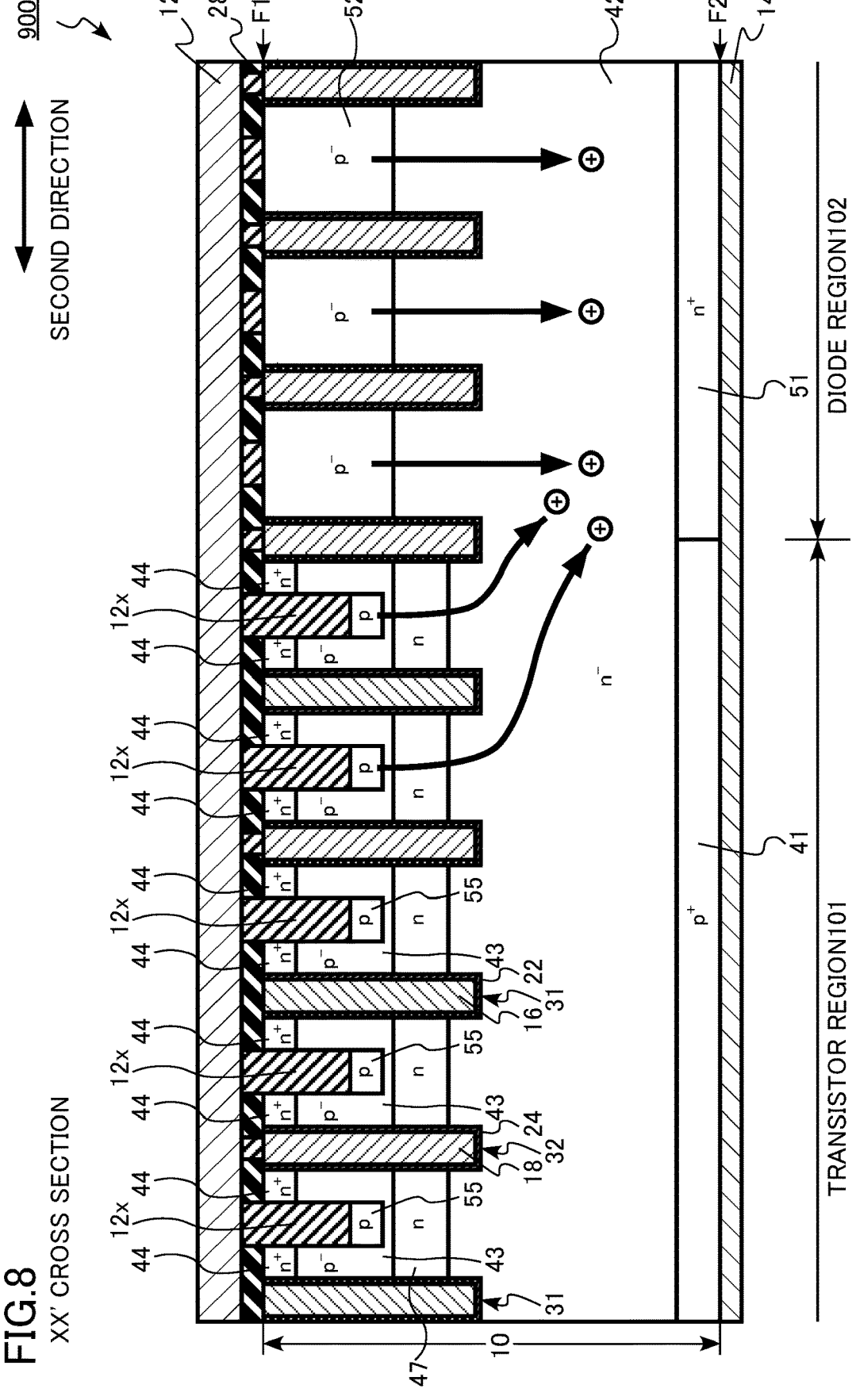
FIG. 8 is an explanatory diagram of the problem of the semiconductor device according to the comparative example.

FIG. 8 is an explanatory diagram of a problem of the semiconductor device according to the comparative example. FIG. 8 is a diagram corresponding to FIG. 5. FIG. 8 is a diagram showing the flow of holes during steady operation of the diode.

As shown in FIG. 8, in the transistor region 101 near the boundary with the diode region 102, the amount of holes injected from the base region 43 into the drift region 42 during steady operation of the diode is large. Therefore, during steady operation of the diode, the amount of holes injected from the transistor region 101 into the drift region 42 of the diode region 102 increases.

The reason why the amount of holes injected into the transistor region 101 of the RC-IGBT 900 according to the comparative example is large is considered to be that the amount of holes injected from the p-type region 55 at the bottom of the first trench contact portion 12*x* is large.

Figure 9:
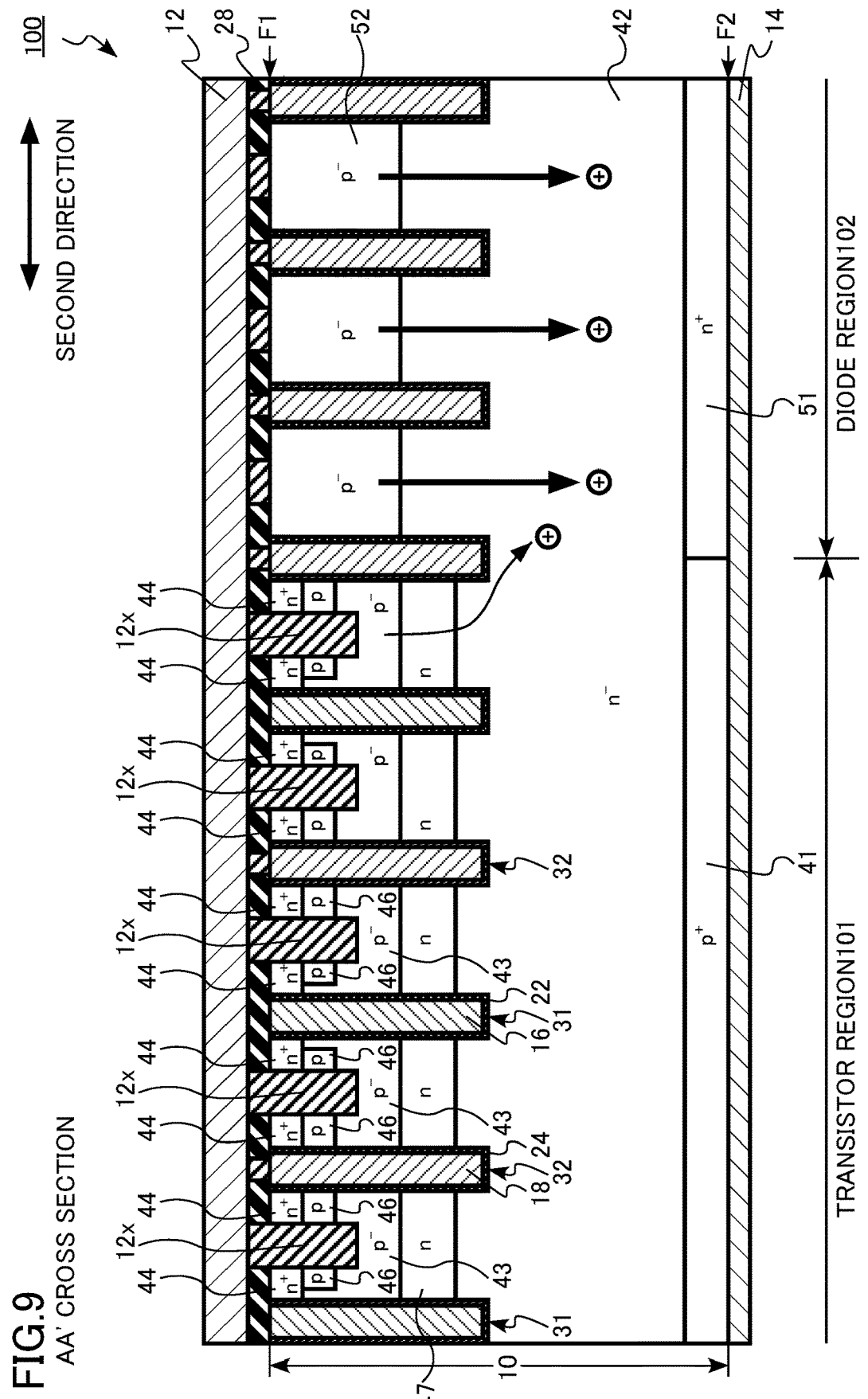
FIG. 9 is an explanatory diagram of the function and effect of the semiconductor device according to the first embodiment.

FIG. 9 is an explanatory diagram of the function and effect of the semiconductor device according to the first embodiment. FIG. 9 is a diagram corresponding to FIG. 2. FIG. 9 is a diagram showing the flow of holes during steady operation of the diode.

As shown in FIG. 9, the amount of holes injected into the transistor region 101 near the boundary with the diode region 102 is smaller than that in the comparative example. The RC-IGBT 100 according to the first embodiment does not include the p-type region 55 at the bottom of the first trench contact portion 12*x*. Therefore, it is considered that holes are not injected from the bottom of the first trench contact portion 12*x*.

In addition, in the RC-IGBT 100 according to the first embodiment, during steady operation of the diode, electrons are discharged to the upper electrode 12 through the contact surface between the bottom surface of the first trench contact portion 12*x* and the base region 43, which make a Schottky contact therebetween. Therefore, it is considered that the injection of holes from the base region 43 into the drift region 42 is suppressed.

Figure 10:
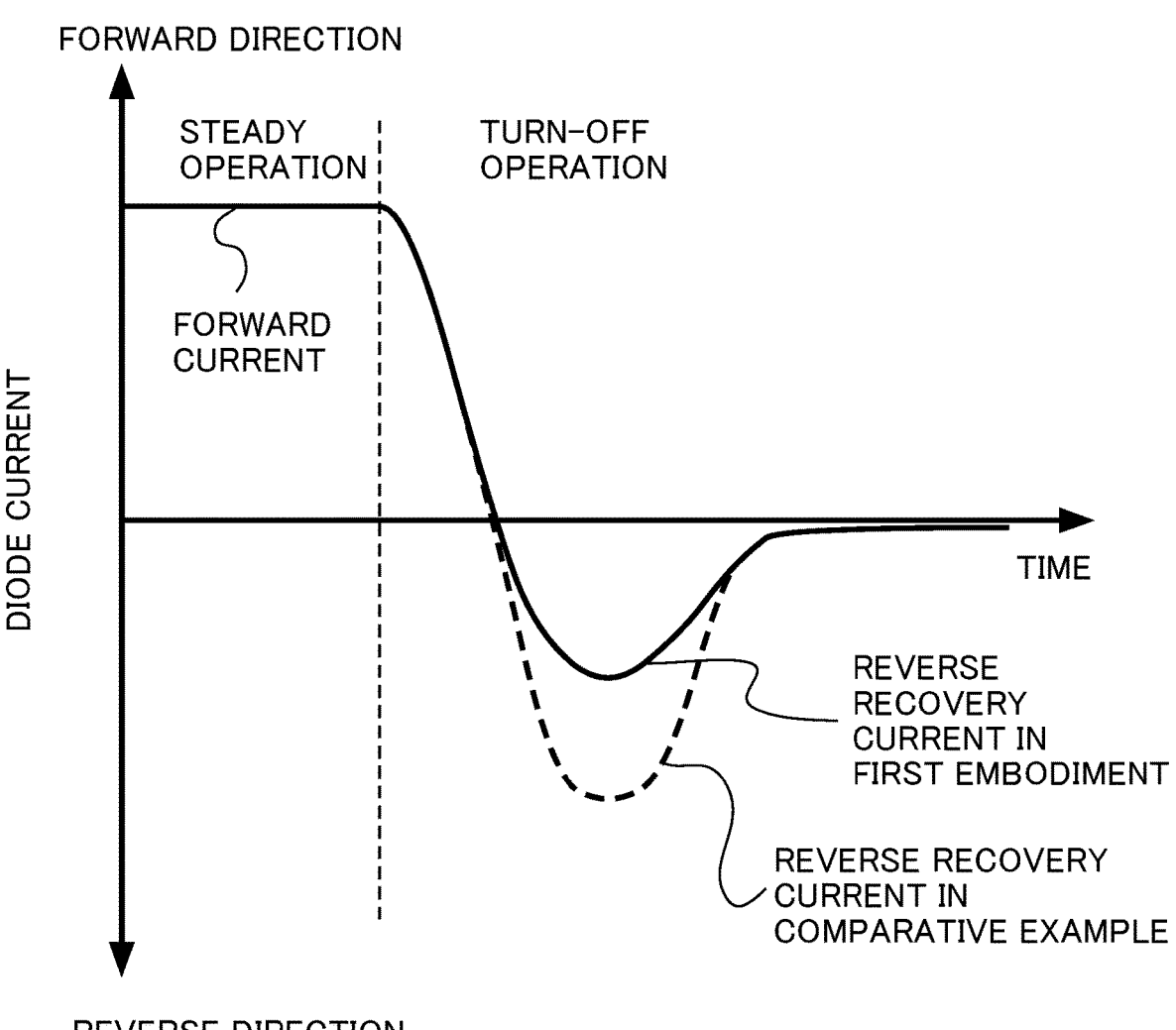
FIG. 10 is an explanatory diagram of the function and effect of the semiconductor device according to the first embodiment.

FIG. 10 is an explanatory diagram of the function and effect of the semiconductor device according to the first embodiment. FIG. 10 is a diagram showing the current characteristics of diodes in the RC-IGBT 100 according to the first embodiment and the RC-IGBT 900 according to the comparative example.

As the amount of holes injected into the diode region 102 from the transistor region 101 near the boundary with the diode region 102 during steady operation of the diode increases, the amount of holes to be discharged to the upper electrode 12 when the diode is turned off increases. As the amount of holes to be discharged from the upper electrode 12 increases, the reverse recovery current of the diode increases. As the reverse recovery current of the diode increases, the switching loss of the diode increases.

In the RC-IGBT 100 according to the first embodiment, the amount of holes injected from the transistor region 101 into the diode region 102 during steady operation of the diode is smaller than that in the RC-IGBT 900 according to the comparative example. Therefore, as shown in FIG. 10, the reverse recovery current of the diode in the RC-IGBT 100 according to the first embodiment is smaller than that in the RC-IGBT 900 according to the comparative example. As a result, in the RC-IGBT 100 according to the first embodiment, the switching loss of the diode is reduced.

The RC-IGBT 100 according to the first embodiment does not include the p-type region 55 at the bottom of the first trench contact portion 12x. However, the RC-IGBT 100 includes the p-type resistance reduction region 46 between the base region 43 and the emitter region 44. The p-type resistance reduction region 46 is in contact with the side surfaces of the first trench contact portion 12x.

Since the RC-IGBT 100 according to the first embodiment includes the resistance reduction region 46 in contact with the side surfaces of the first trench contact portion 12x, the discharge of holes from the resistance reduction region 46 to the upper electrode 12 when the IGBT is turned off is promoted. Therefore, the operation of the parasitic npn transistor in the transistor region 101 is suppressed. As a result, the latch-up immunity of the RC-IGBT 100 is improved.

As described above, according to the RC-IGBT 100 according to the first embodiment, it is possible to achieve both a reduction in switching loss and an improvement in latch-up immunity.

From the viewpoint of promoting the discharge of holes from the resistance reduction region 46 to the upper electrode 12, it is preferable that the p-type impurity concentration in the resistance reduction region 46 is high. The p-type impurity concentration in the resistance reduction region 46 is higher than the p-type impurity concentration in the base region 43. The p-type impurity concentration in the resistance reduction region 46 is preferably equal to or more than $5\times10^{17}$ cm$^{-3}$, more preferably equal to or more than $1\times10^{18}$ cm$^{-3}$, and even more preferably equal to or more than $5\times10^{18}$ cm$^{-3}$.

From the viewpoint of stabilizing the threshold voltage of the IGBT, it is preferable that the p-type impurity concentration of the resistance reduction region 46 adjacent to the channel region of the IGBT is low. The p-type impurity concentration of the resistance reduction region 46 is lower than the p-type impurity concentration of the cell contact region 45. The p-type impurity concentration of the resistance reduction region 46 is preferably equal to or less than $1\times10^{19}$ cm$^{-3}$.

From the viewpoint of facilitating the formation of the resistance reduction region 46, it is preferable to provide the first dummy trench 32 in contact with the resistance reduction region 46. Since the width of the resistance reduction region 46 in the second direction can be increased, it becomes easy to form the resistance reduction region 46.

From the viewpoint of improving the latch-up immunity, it is preferable to provide the first dummy trench 32. In particular, since the first conductive layer 18 in the first dummy trench 32 is electrically connected to the upper electrode 12, holes easily flow along the side surfaces of the first dummy trench 32 when the IGBT is turned off. Therefore, the discharge of holes from the resistance reduction region 46 to the upper electrode 12 is promoted. As a result, the latch-up immunity of the RC-IGBT 100 is improved.

From the viewpoint of improving the latch-up immunity, it is preferable that the width of the emitter region 44 in the first direction is small. From the viewpoint of improving the latch-up immunity, it is preferable that the width of the emitter region 44 in the first direction on the first face F1 is smaller than the width of the cell contact region 45 in the first direction on the first face F1. In addition, by adjusting the width of the emitter region 44 and the width of the cell contact region 45 to adjust the transconductance, it is possible to increase the short circuit withstand time.

From the viewpoint of promoting the discharge of electrons to the upper electrode 12 during steady operation of the diode and suppressing the injection of holes into the drift region 42, it is preferable that the base region 43 is in contact with the side surfaces of the first trench contact portion 12x.

In addition, although the case where there are one transistor region 101 and one diode region 102 has been exemplified in FIG. 1, each of the transistor region 101 and the diode region 102 may be divided into a plurality of regions and arranged alternately. By dividing each of the transistor region 101 and the diode region 102 into a plurality of regions, the generation of heat in the IGBT and the diode can be made uniform.

First Modification Example

A semiconductor device according to a first modification example of the first embodiment is different from the semiconductor device according to the first embodiment in that the diode region further includes a tenth semiconductor region between the second semiconductor region and the eighth semiconductor region.

Figure 11:
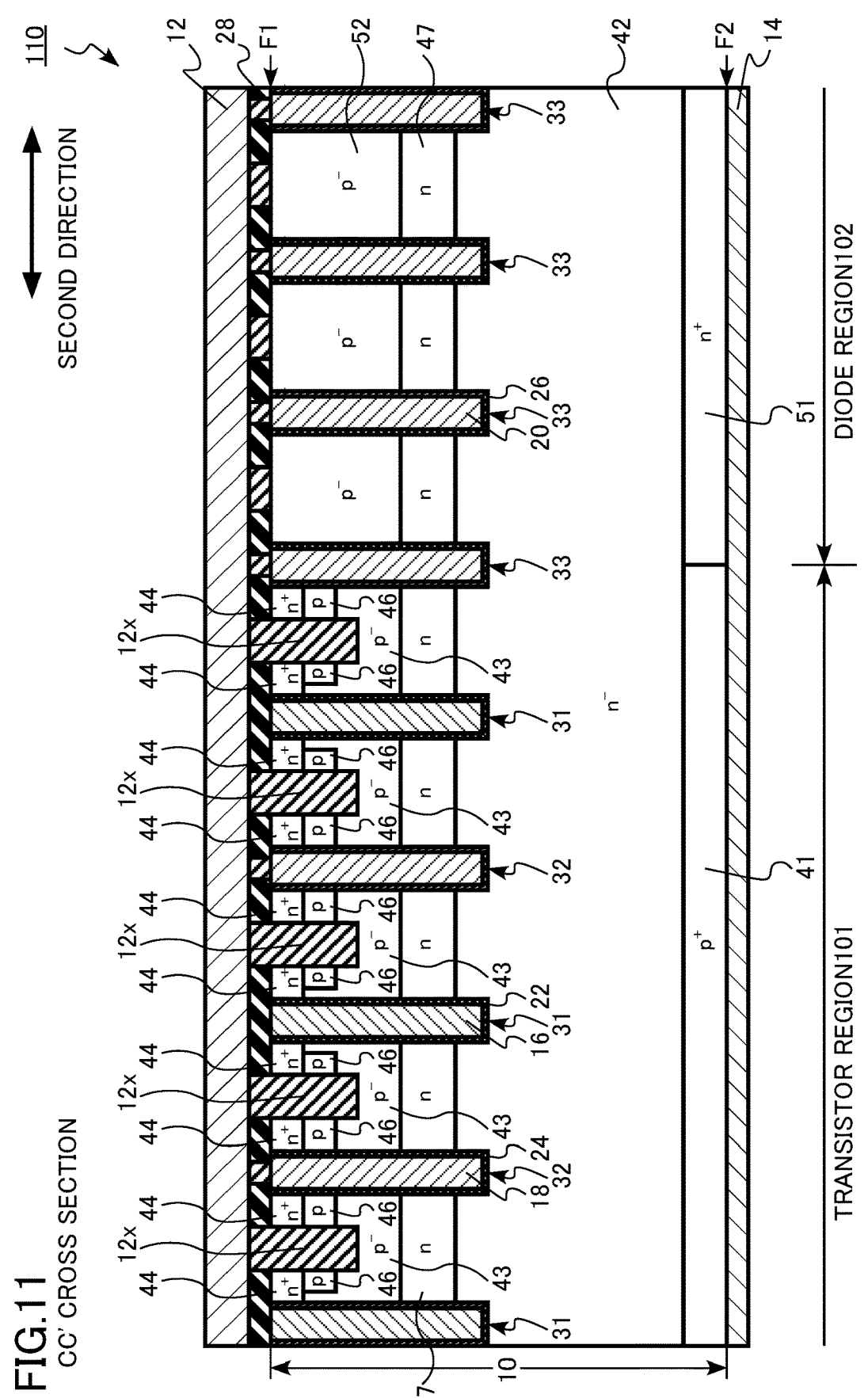
FIG. 11 is a schematic cross-sectional view of a part of a semiconductor device according to a first modification example of the first embodiment.

FIG. 11 is a schematic cross-sectional view of a part of the semiconductor device according to the first modification example of the first embodiment. FIG. 11 is a cross-sectional view taken along the line CC' of FIG. 12. FIG. 11 is a diagram corresponding to FIG. 2 in the first embodiment.

Figure 12:
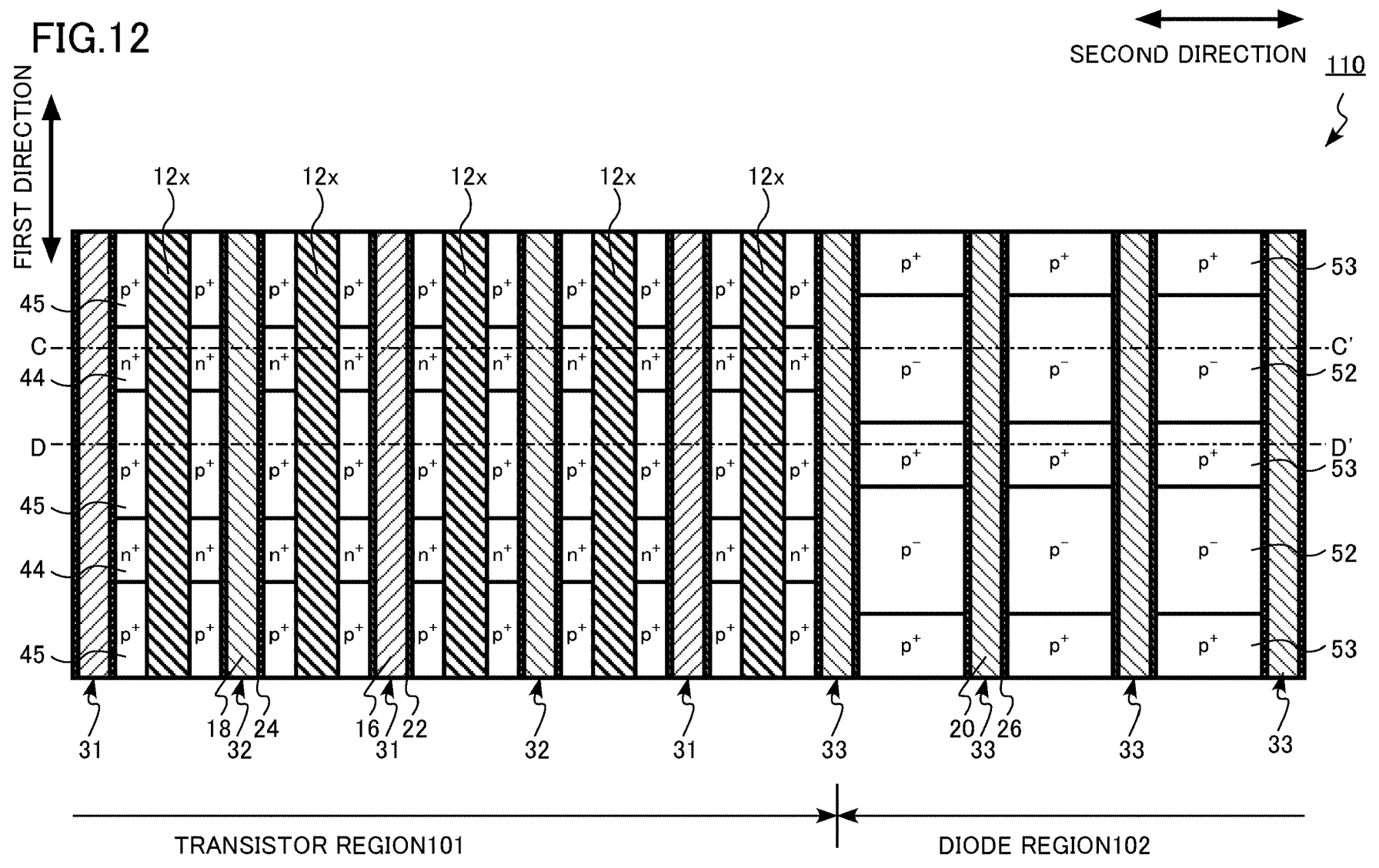

FIG. 12 is a schematic top view of a part of the semiconductor device according to the first modification example of the first embodiment. FIG. 12 is a top view on the first face F1. FIG. 12 is a diagram corresponding to FIG. 3 in the first embodiment.

Figure 13:
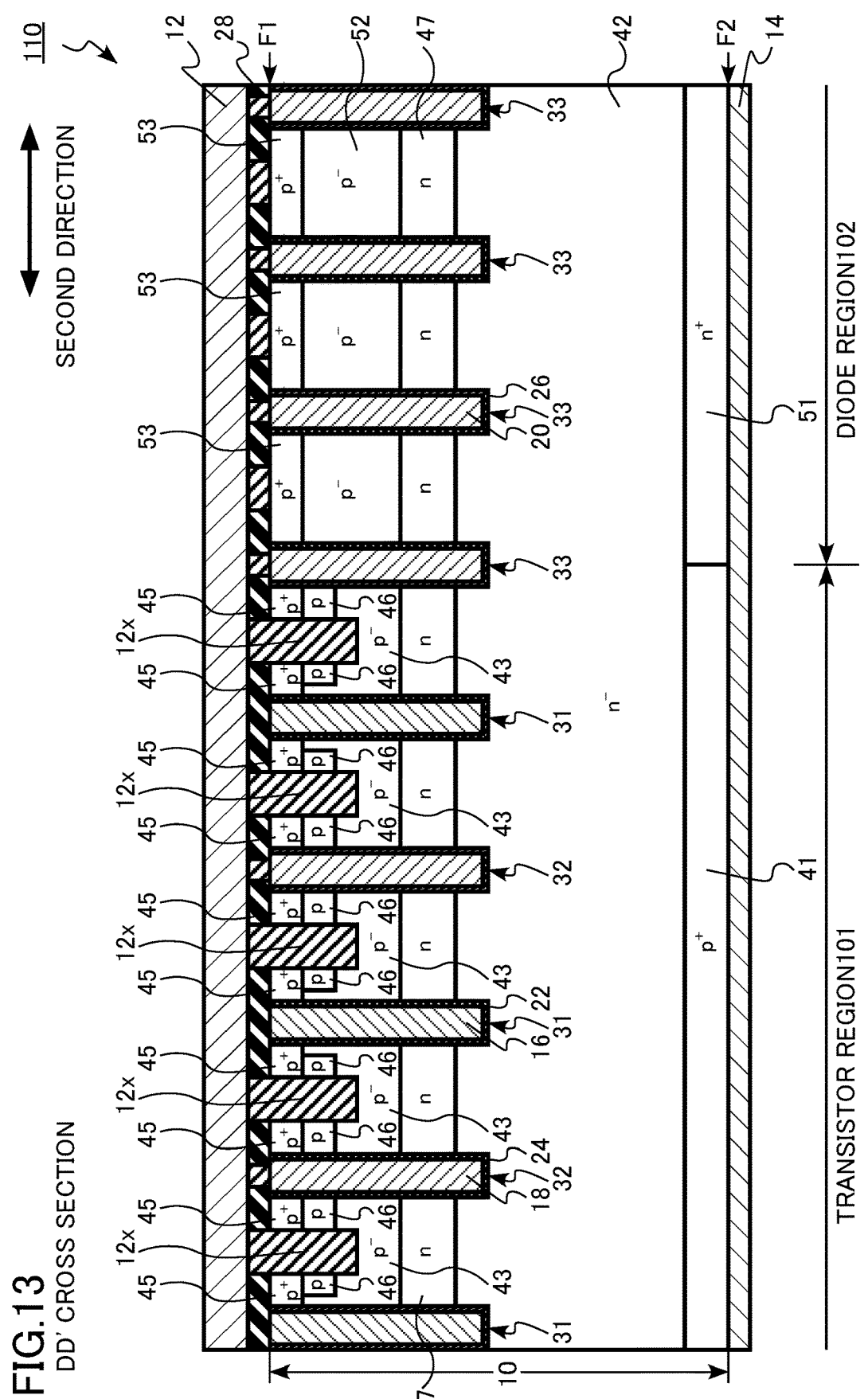
FIG. 13 is a schematic cross-sectional view of a part of the semiconductor device according to the first modification example of the first embodiment.

FIG. 13 is a schematic cross-sectional view of a part of the semiconductor device according to the first modification example of the first embodiment. FIG. 13 is a cross-sectional view taken along the line DD' of FIG. 12. FIG. 13 is a diagram corresponding to FIG. 4 according to the first embodiment.

The semiconductor device according to the first modification example of the first embodiment is an RC-IGBT 110. The RC-IGBT 110 is different from the RC-IGBT 100 according to the first embodiment in that the diode region 102 includes the barrier region 47.

The barrier region 47 is an n-type semiconductor region. The barrier region 47 is provided between the drift region 42 and the anode region 52.

The barrier region 47 contains n-type impurities. The n-type impurity is, for example, phosphorus (P) or arsenic (As). The n-type impurity concentration in the barrier region 47 is, for example, equal to or more than $5 \times 10^{15}$ cm$^{-3}$ and equal to or less than $5 \times 10^{18}$ cm$^{-3}$.

The barrier region 47 has a function of suppressing the injection of holes into the drift region 42 when the diode is ON. Therefore, the amount of holes to be discharged to the upper electrode 12 when the diode is turned off is reduced. As the amount of holes to be discharged from the upper electrode 12 decreases, the reverse recovery current of the diode decreases. As the reverse recovery current of the diode decreases, the switching loss of the diode decreases.

Therefore, according to the RC-IGBT 110 according to the first modification example of the first embodiment, it is possible to further reduce the switching loss.

Second Modification Example

A semiconductor device according to a second modification example of the first embodiment is different from the semiconductor device according to the first embodiment in that the diode region further includes an eleventh semiconductor region of the first conductive type having a first conductive type impurity concentration higher than that in the eighth semiconductor region, the first electrode of the diode region includes a second portion, side surfaces of the second portion are in contact with the eighth semiconductor region, a bottom surface of the second portion is in contact with the eleventh semiconductor region, and the eleventh semiconductor region is provided between the eighth semiconductor region and the second portion.

Figure 14:
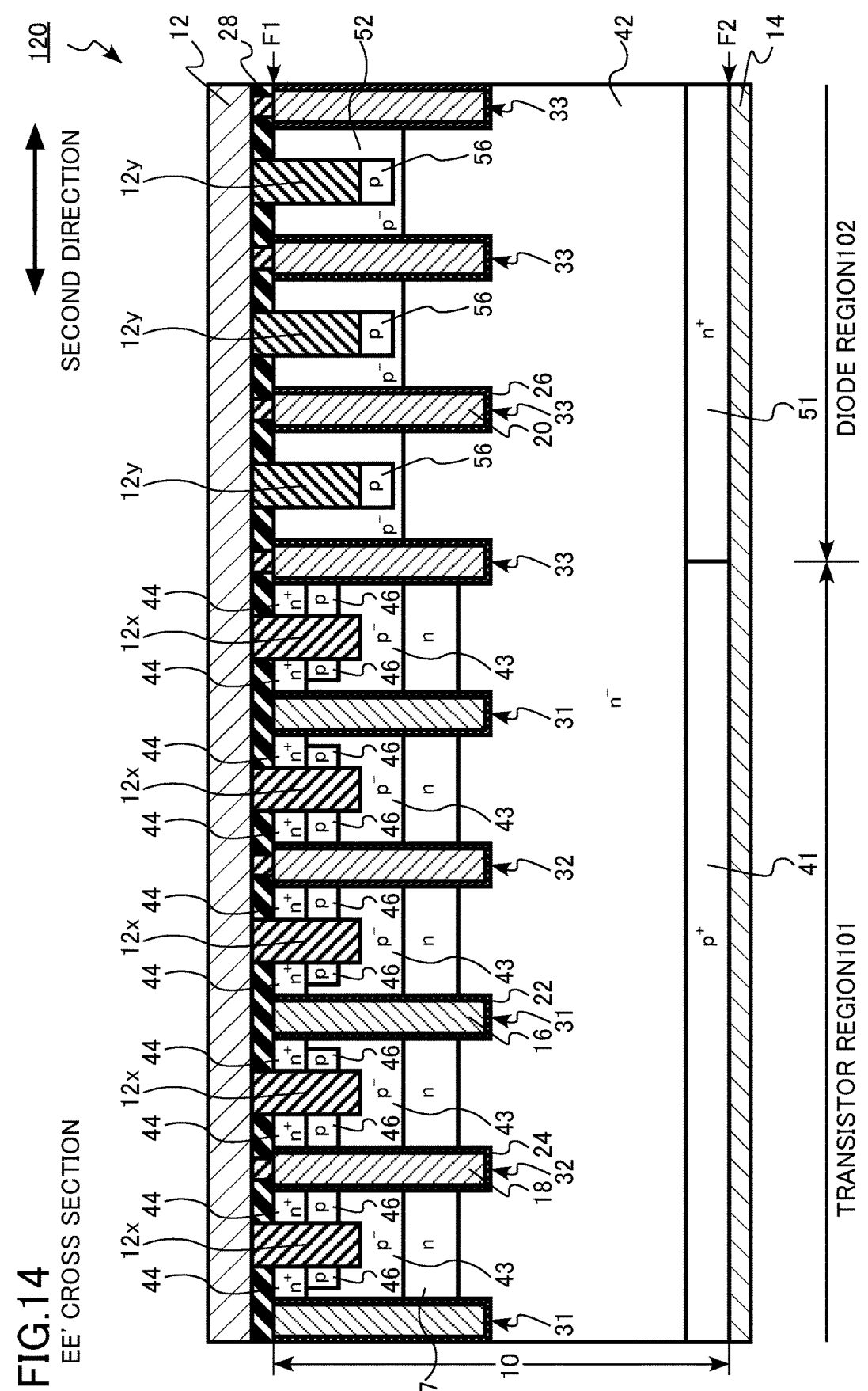
FIG. 14 is a schematic cross-sectional view of a part of a semiconductor device according to a second modification example of the first embodiment.

FIG. 14 is a schematic cross-sectional view of a part of a semiconductor device according to a second modification example of the first embodiment. FIG. 14 is a cross-sectional view taken along the line EE' of FIG. 15. FIG. 14 is a diagram corresponding to FIG. 2 in the first embodiment.

Figure 15:
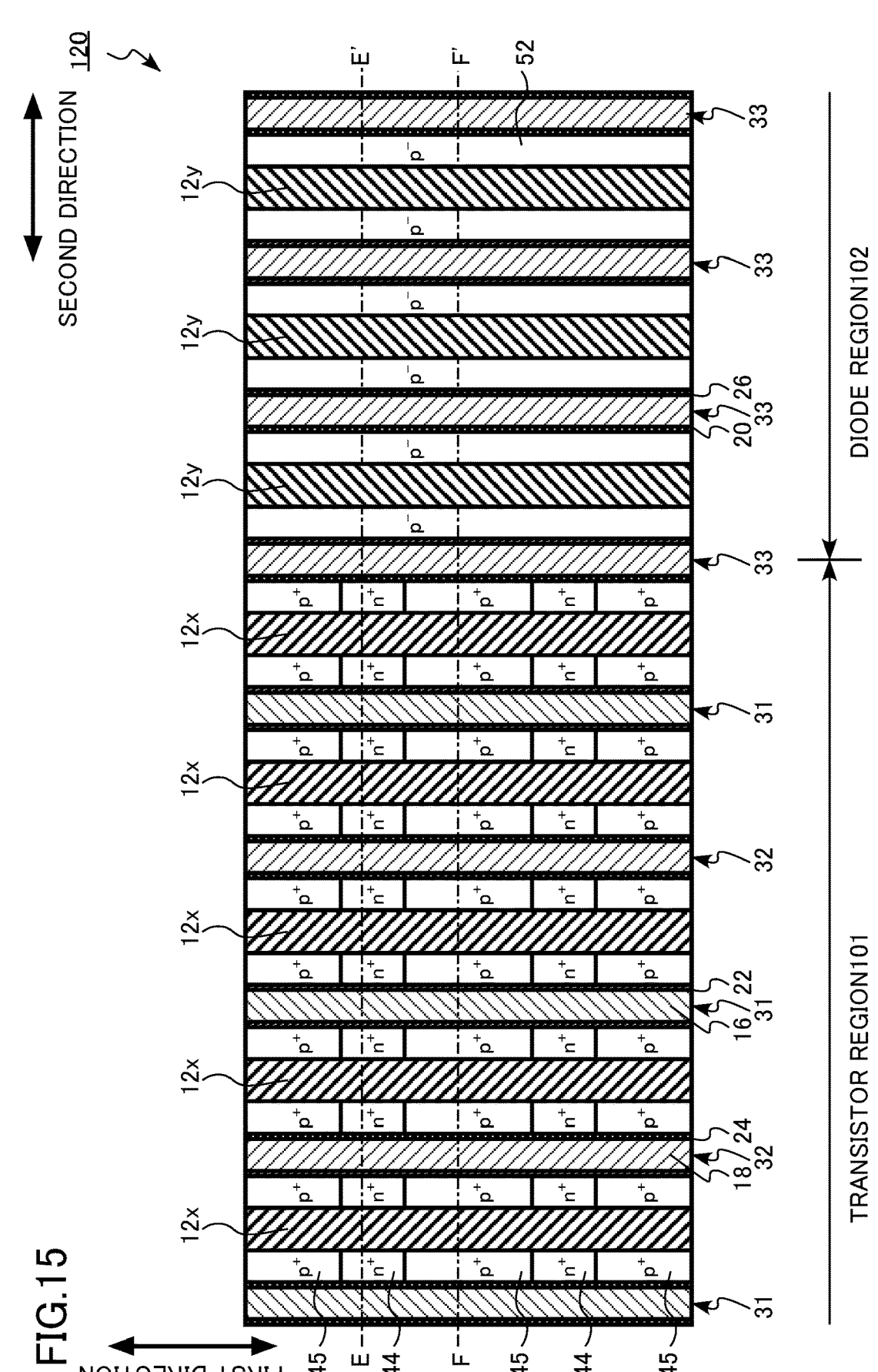
FIG. 15 is a schematic top view of a part of the semiconductor device according to the second modification example of the first embodiment.

FIG. 15 is a schematic top view of a part of the semiconductor device according to the second modification example of the first embodiment. FIG. 15 is a top view on the first face F1. FIG. 15 is a diagram corresponding to FIG. 3 in the first embodiment.

Figure 16:
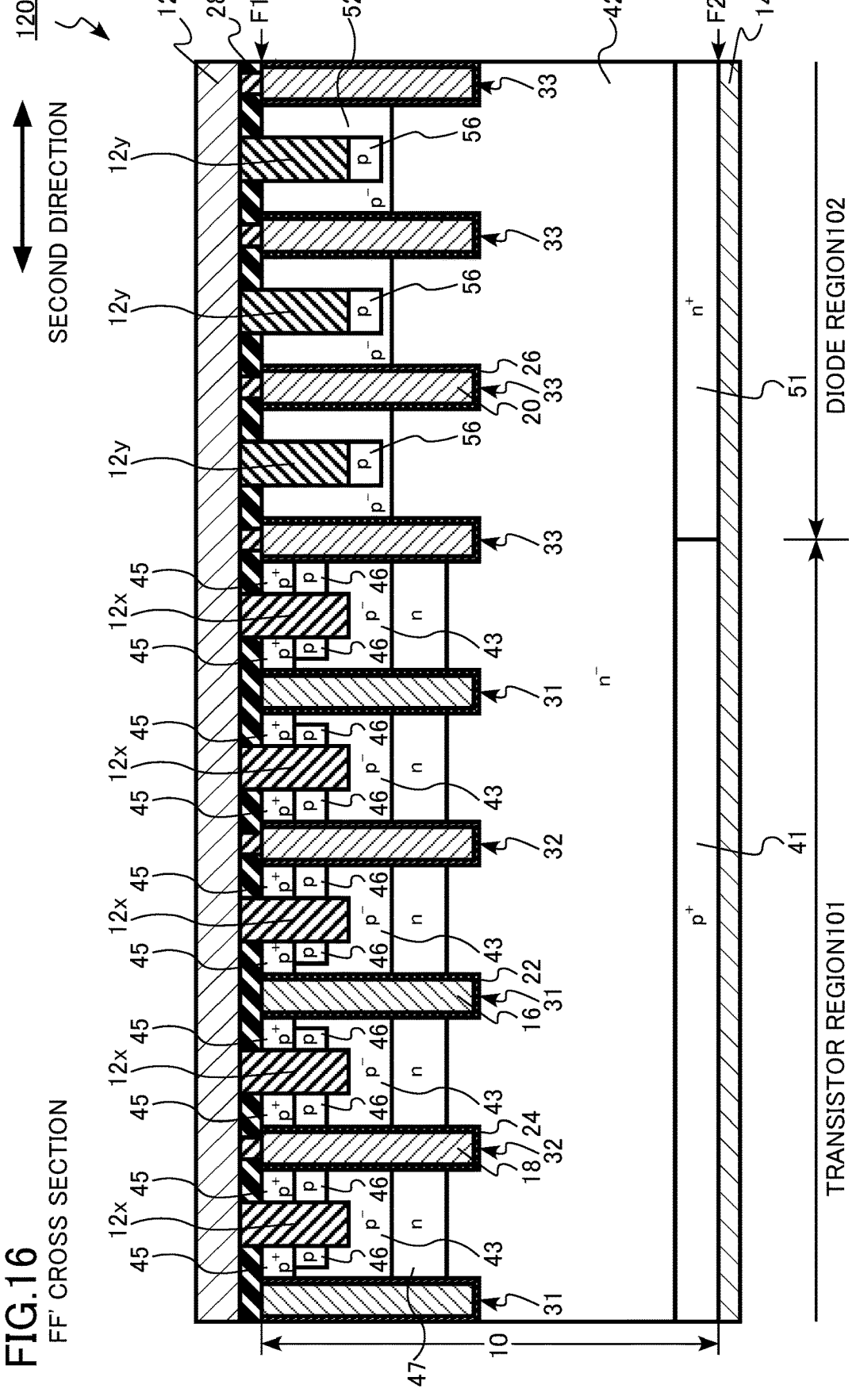
FIG. 16 is a schematic cross-sectional view of a part of the semiconductor device according to the second modification example of the first embodiment.

FIG. 16 is a schematic cross-sectional view of a part of the semiconductor device according to the second modification example of the first embodiment. FIG. 16 is a cross-sectional view taken along the line FF' of FIG. 15. FIG. 16 is a diagram corresponding to FIG. 4 in the first embodiment.

The semiconductor device according to the second modification example of the first embodiment is an RC-IGBT 120. The RC-IGBT 120 is different from the RC-IGBT 100 according to the first embodiment in that the diode region 102 includes a trench bottom p-type region 56 (eleventh semiconductor region) and the upper electrode 12 of the diode region 102 has a second trench contact portion 12y (second portion).

The second trench contact portion 12y is formed in a trench provided in the semiconductor layer 10. The second trench contact portion 12y extends in the first direction.

The bottom surface of the second trench contact portion 12y is in contact with the trench bottom p-type region 56. The side surfaces of the second trench contact portion 12y are in contact with the anode region 52. The second trench contact portion 12y is electrically connected to the trench bottom p-type region 56 and the anode region 52.

The trench bottom p-type region 56 is a p-type semiconductor region. The trench bottom p-type region 56 is provided between the anode region 52 and the second trench contact portion 12y. The trench bottom p-type region 56 is in contact with the second trench contact portion 12y.

The p-type impurity concentration in the trench bottom p-type region 56 is higher than the p-type impurity concentration in the anode region 52. The contact between the second trench contact portion 12y and the trench bottom p-type region 56 is, for example, an ohmic contact.

According to the RC-IGBT 120 according to the second modification example of the first embodiment, for example, the first trench contact portion 12x of the transistor region 101 and the second trench contact portion 12y of the diode region 102 can be manufactured through a common process.

As described above, according to the first embodiment and its modification examples, it is possible to provide semiconductor devices that can achieve both a reduction in switching loss and an improvement in latch-up immunity.

Second Embodiment

A semiconductor device according to a second embodiment is different from the semiconductor device according to the first embodiment in that the transistor region does not include the second trench. Hereinafter, the description of a part of the content overlapping the first embodiment may be omitted.

The semiconductor device according to the second embodiment is an RC-IGBT 200 in which an IGBT and a freewheeling diode are formed in the same semiconductor chip. The RC-IGBT 200 has a trench gate type IGBT including a gate electrode in a trench formed in a semiconductor layer. Hereinafter, a case where the first conductive type is p-type and the second conductive type is n-type will be described as an example.

Figure 17:
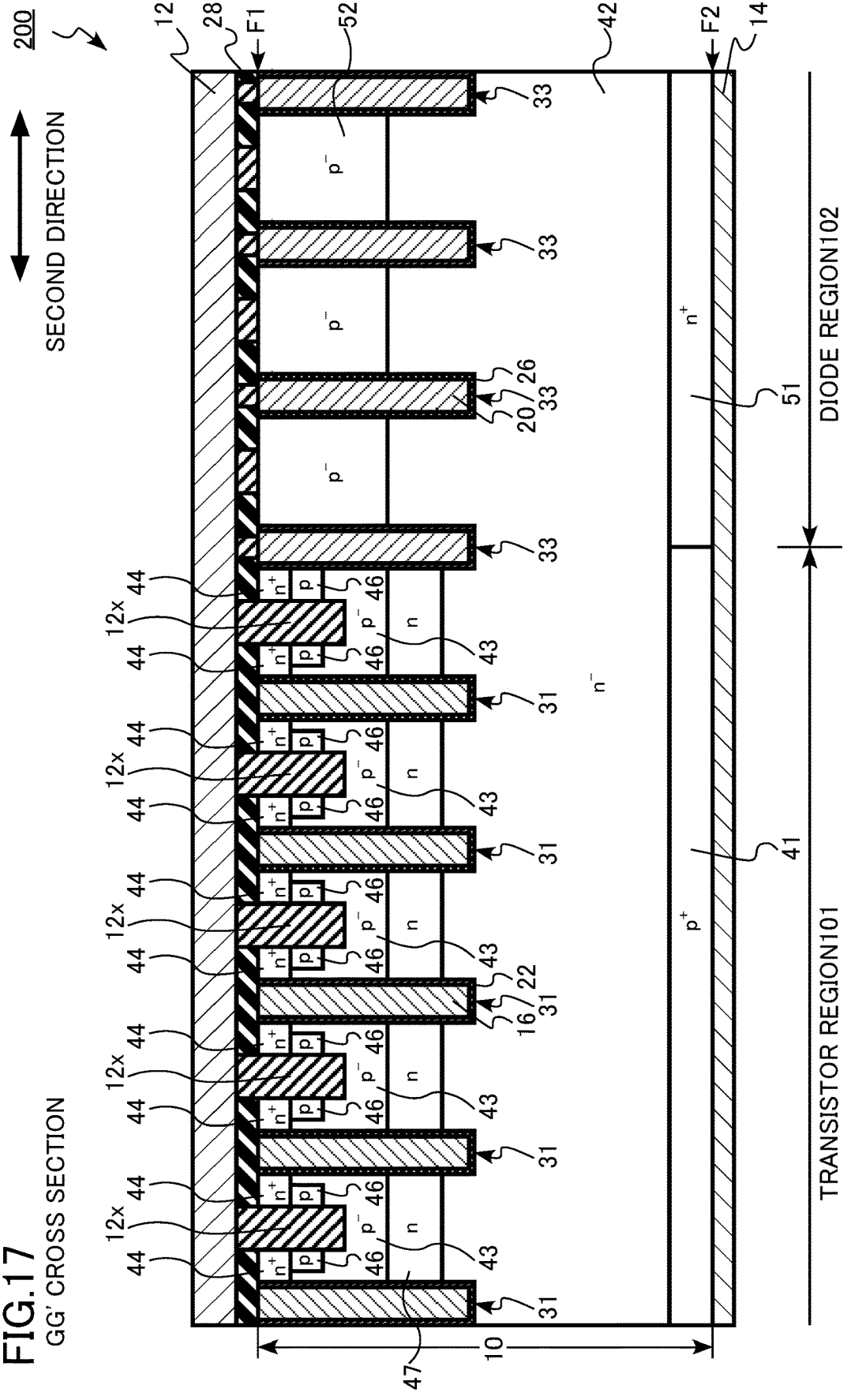
FIG. 17 is a schematic cross-sectional view of a part of a semiconductor device according to a second embodiment.

FIG. 17 is a schematic cross-sectional view of a part of the semiconductor device according to the second embodiment. FIG. 17 is a cross-sectional view taken along the line GG' of FIG. 18. FIG. 17 is a diagram corresponding to FIG. 2 in the first embodiment.

Figure 18:
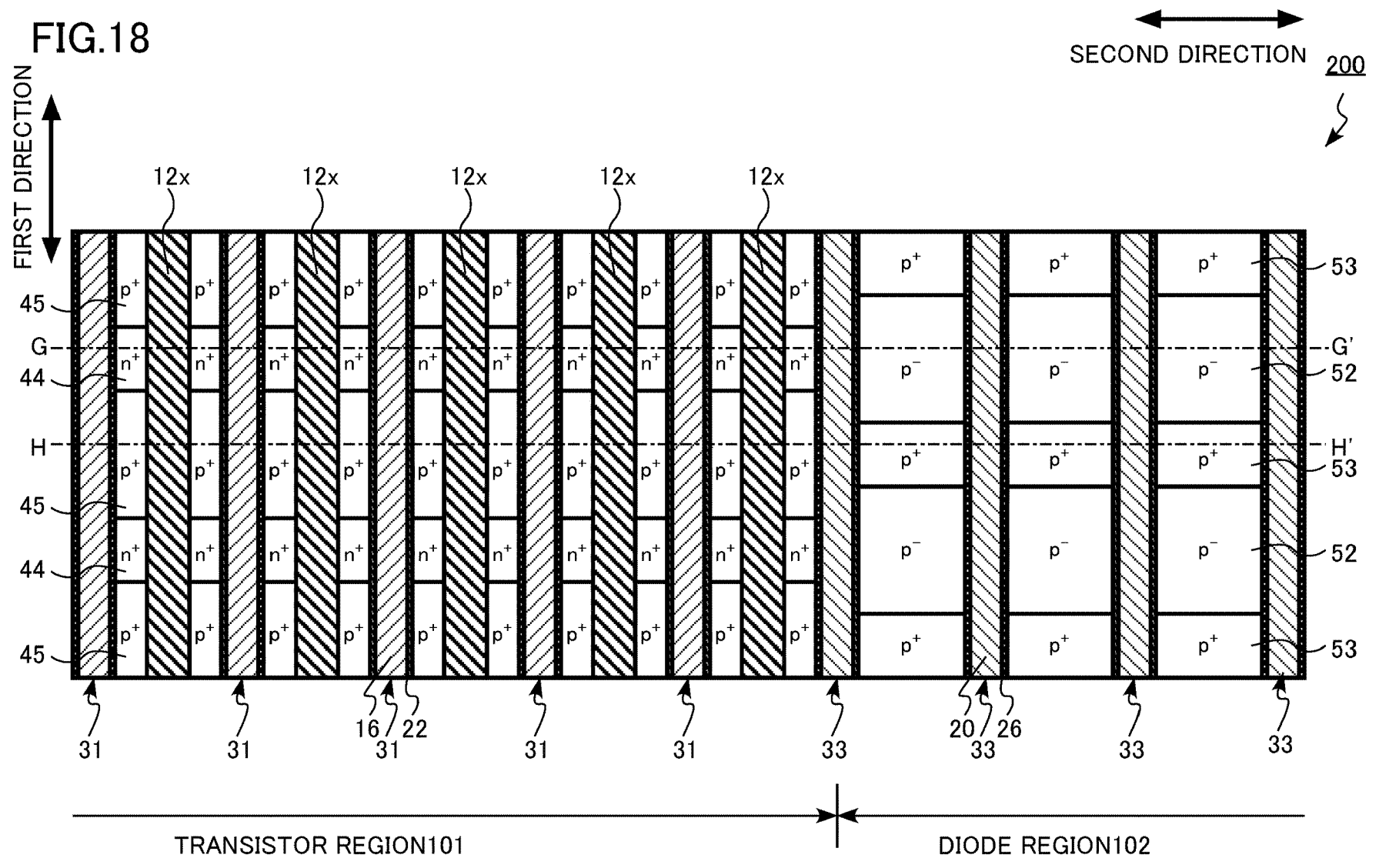

FIG. 18 is a schematic top view of a part of the semiconductor device according to the second embodiment. FIG. 18 is a top view on the first face F1. FIG. 18 is a diagram corresponding to FIG. 3 in the first embodiment.

Figure 19:
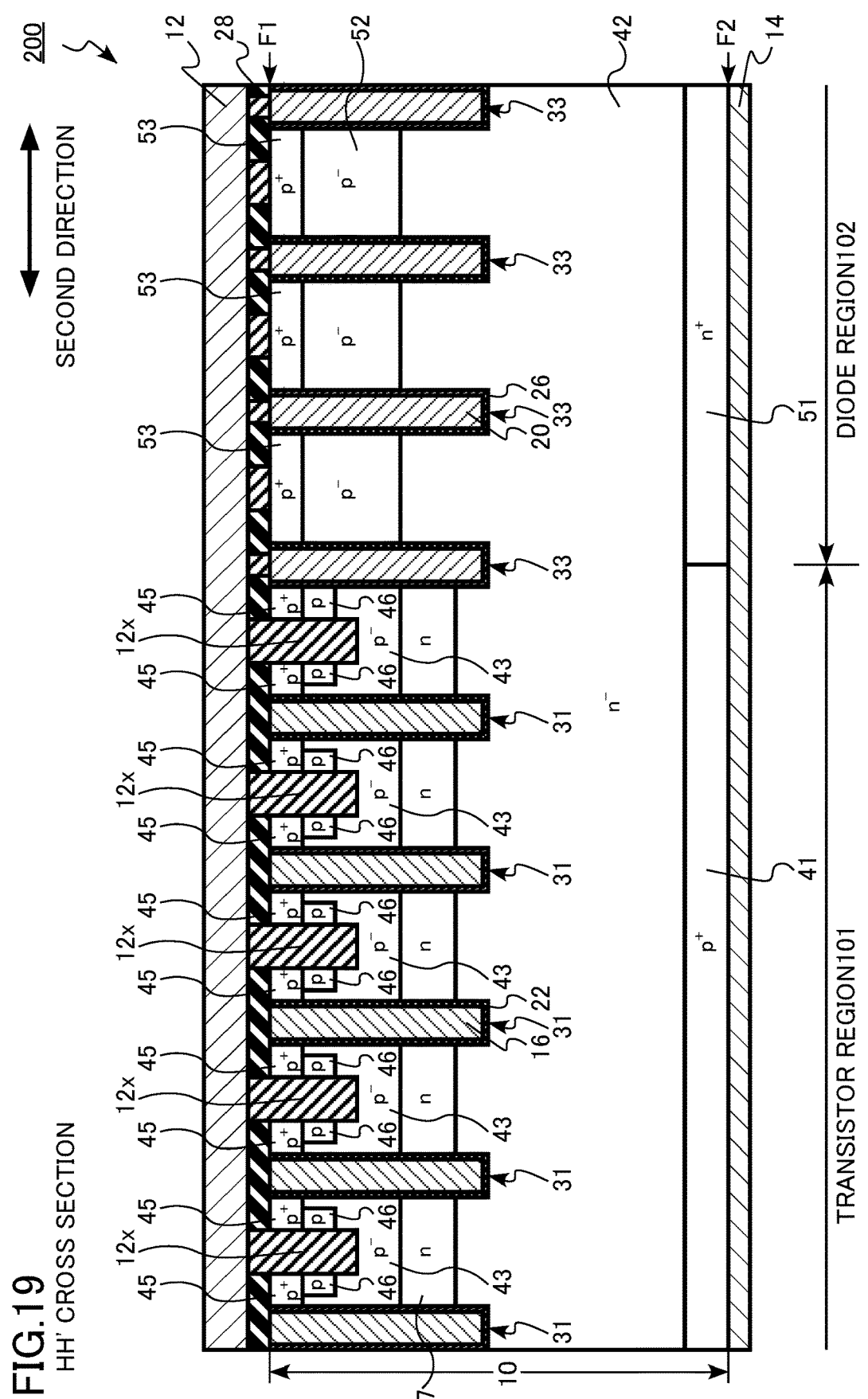
FIG. 19 is a schematic cross-sectional view of a part of the semiconductor device according to the second embodiment.

FIG. 19 is a schematic cross-sectional view of a part of the semiconductor device according to the second embodiment. FIG. 19 is a cross-sectional view taken along the line HH' of FIG. 18. FIG. 19 is a diagram corresponding to FIG. 4 in the first embodiment.

The semiconductor device according to the second embodiment is the RC-IGBT 200. The RC-IGBT 200 has a transistor region 101 and a diode region 102.

The transistor region 101 operates as an IGBT. The diode region 102 operates as a freewheeling diode.

The RC-IGBT 200 according to the second embodiment includes a semiconductor layer 10, an upper electrode 12 (first electrode), a lower electrode 14 (second electrode), a gate electrode 16, a second conductive layer 20, a gate insulating film 22, a second insulating film 26, an interlayer insulating layer 28, and a gate electrode pad 103.

The upper electrode 12 has a first trench contact portion 12x (first portion).

In the semiconductor layer 10, a gate trench 31 (first trench), a second dummy trench 33 (third trench), a collector region 41 (first semiconductor region), a drift region 42 (second semiconductor region), a base region 43 (third semiconductor region), an emitter region 44 (fourth semiconductor region), a cell contact region 45 (fifth semiconductor region), a resistance reduction region 46 (sixth semiconductor region), a barrier region 47 (tenth semiconductor region), a cathode region 51 (seventh semiconductor region), an anode region 52 (eighth semiconductor region), and a diode contact region 53 (ninth semiconductor region) are provided.

In the RC-IGBT 200 according to the second embodiment, it is possible to achieve both a reduction in switching loss and an improvement in latch-up immunity, as in the RC-IGBT 100 according to the first embodiment.

In addition, in the RC-IGBT 200 according to the second embodiment, the occupation rate of the gate trench 31 in the transistor region 101 is higher than that in the RC-IGBT 100 according to the first embodiment. Therefore, for example, it is possible to realize the RC-IGBT 200 with lower on-resistance and higher on-current than the RC-IGBT 100 according to the first embodiment.

As described above, according to the second embodiment, it is possible to provide a semiconductor device that can achieve both a reduction in switching loss and an improvement in latch-up immunity.

In the first and second embodiments, the case where the semiconductor layer is single crystal silicon has been described as an example. However, the semiconductor layer is not limited to the single crystal silicon. For example, other single crystal semiconductors, such as single crystal silicon carbide, may be used.

In the first and second embodiments, the case where the first conductive type is p-type and the second conductive type is n-type has been described as an example. However, the first conductive type can be n-type and the second conductive type can be p-type.

In the first and second embodiments, the case where the second dummy trench 33 is provided in the diode region 102 has been described as an example. However, it is also possible not to provide the second dummy trench 33 in the diode region 102.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a transistor region including:
a semiconductor layer having a first face and a second face opposite to the first face;
a first semiconductor region of a first conductive type provided in the semiconductor layer;
a second semiconductor region of a second conductive type provided in the semiconductor layer and provided between the first semiconductor region and the first face;
a third semiconductor region of the first conductive type provided in the semiconductor layer and provided between the second semiconductor region and the first face;
a fourth semiconductor region of the second conductive type and a fifth semiconductor region of the first conductive type provided in the semiconductor layer, provided between the third semiconductor region and the first face, and arranged alternately in a first direction parallel to the first face;
a sixth semiconductor region of the first conductive type provided between the third semiconductor region and the fourth semiconductor region and having a first conductive type impurity concentration higher than a first conductive type impurity concentration in the third semiconductor region and lower than a first conductive type impurity concentration in the fifth semiconductor region;
a first trench provided on a first face side in the semiconductor layer, extending in the first direction, repeatedly arranged in a second direction parallel to the first face and perpendicular to the first direction, in contact with the second semiconductor region, the third semiconductor region, the fourth semiconductor region, and the fifth semiconductor region, and spaced from the sixth semiconductor region;
a gate electrode provided in the first trench;
a gate insulating film provided between the gate electrode and the third semiconductor region;
a first electrode provided on the first face side with respect to the semiconductor layer and having a first portion, a bottom surface of the first portion being in contact with the third semiconductor region and side surfaces of the first portion being in contact with the fourth semiconductor region, the fifth semiconductor region, and the sixth semiconductor region; and
a second electrode provided on a second face side with respect to the semiconductor layer and in contact with the first semiconductor region; and
a diode region including:
the semiconductor layer;
the second semiconductor region;
a seventh semiconductor region of the second conductive type provided in the semiconductor layer, provided between the second semiconductor region and the second face, and having a second conductive type impurity concentration higher than a second conductive type impurity concentration in the second semiconductor region;
an eighth semiconductor region of the first conductive type provided in the semiconductor layer and provided between the second semiconductor region and the first face;
the first electrode electrically connected to the eighth semiconductor region; and
the second electrode in contact with the seventh semiconductor region.

2. The semiconductor device according to claim 1, wherein the sixth semiconductor region extends in the first direction, and the fifth semiconductor region is provided between the sixth semiconductor region and the first face.

3. The semiconductor device according to claim 1, wherein the sixth semiconductor region is provided between the first trench and the first portion.

4. The semiconductor device according to claim 1, wherein the transistor region further includes:
a second trench provided on the first face side in the semiconductor layer, provided between two adjacent first trenches, extending in the first direction, and in contact with the second semiconductor region, the third semiconductor region, the fourth semiconductor region, the fifth semiconductor region, and the sixth semiconductor region;

a first conductive layer provided in the second trench; and a first insulating film provided between the first conductive layer and the third semiconductor region.

5. The semiconductor device according to claim 4, wherein the first conductive layer is electrically connected to the first electrode.

6. The semiconductor device according to claim 1, wherein a width of the fourth semiconductor region in the first direction is smaller than a width of the fifth semiconductor region in the first direction.

7. The semiconductor device according to claim 1, wherein the diode region further includes a ninth semiconductor region of the first conductive type provided in the semiconductor layer, provided between the eighth semiconductor region and the first face, and having a first conductive type impurity concentration higher than a first conductive type impurity concentration in the eighth semiconductor region, and the first electrode is in contact with the ninth semiconductor region.

8. The semiconductor device according to claim 1, wherein the transistor region further includes a tenth semiconductor region of the second conductive type provided between the second semiconductor region and the third semiconductor region and having a second conductive type impurity concentration higher than a second conductive type impurity concentration in the second semiconductor region.

9. The semiconductor device according to claim 8, wherein the diode region further includes the tenth semiconductor region provided between the second semiconductor region and the eighth semiconductor region.

10. The semiconductor device according to claim 1, wherein the diode region further includes an eleventh semiconductor region of the first conductive type having a first conductive type impurity concentration higher than a first conductive type impurity concentration in the eighth semiconductor region, the first electrode of the diode region includes a second portion, side surfaces of the second portion are in contact with the eighth semiconductor region, and a bottom surface of the second portion is in contact with the eleventh semiconductor region, and the eleventh semiconductor region is provided between the eighth semiconductor region and the second portion.

11. The semiconductor device according to claim 1, wherein the diode region further includes:

a third trench provided on the first face side in the semiconductor layer, extending in the first direction, and in contact with the second semiconductor region and the eighth semiconductor region;

a second conductive layer provided in the third trench; and a second insulating film provided between the second conductive layer and the eighth semiconductor region.

12. The semiconductor device according to claim 11, wherein the second conductive layer is electrically connected to the first electrode.

13. The semiconductor device according to claim 1, wherein the side surfaces of the first portion are in contact with the third semiconductor region.

14. The semiconductor device according to claim 1, wherein a depth of the sixth semiconductor region is smaller than a depth of the first portion.

* * * * *